United States Patent
Hill

(10) Patent No.: US 6,847,452 B2
(45) Date of Patent: *Jan. 25, 2005

(54) PASSIVE ZERO SHEAR INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 175 days.

This patent is subject to a terminal disclaimer.

(21) Appl. No.: 10/207,314

(22) Filed: Jul. 29, 2002

(65) Prior Publication Data

US 2003/0053073 A1 Mar. 20, 2003

Related U.S. Application Data

(60) Provisional application No. 60/309,608, filed on Aug. 2, 2001, provisional application No. 60/314,345, filed on Aug. 23, 2001, and provisional application No. 60/314,569, filed on Aug. 23, 2001.

(51) Int. Cl.[7] .................................................. G01B 9/02
(52) U.S. Cl. .................................... 356/450; 756/498
(58) Field of Search ................................ 356/450, 493, 356/508, 520, 498, 509, 486

(56) References Cited

U.S. PATENT DOCUMENTS

| | | | |
|---|---|---|---|
| 4,606,638 A | 8/1986 | Sommargren | |
| 4,662,750 A | 5/1987 | Barger | |
| 4,711,573 A | 12/1987 | Wijntjes et al. | |
| 4,790,651 A | 12/1988 | Brown et al. | |
| 4,802,765 A | 2/1989 | Young et al. | |
| 4,859,066 A | 8/1989 | Sommargren | |
| 4,881,816 A | 11/1989 | Zanomi | |
| 5,064,289 A | 11/1991 | Bockman | |
| 5,114,234 A | 5/1992 | Otsuka et al. | |
| 5,187,543 A | 2/1993 | Ebert | |
| 5,408,318 A | 4/1995 | Slater | |
| 5,491,550 A | 2/1996 | Dabbs | |
| 5,724,136 A | 3/1998 | Zanoni | |
| 5,757,160 A | 5/1998 | Kreuzer | |
| 5,764,361 A | 6/1998 | Kato et al. | |
| 5,781,277 A | 7/1998 | Iwamoto | |
| 5,781,297 A | 7/1998 | Castore | 356/349 |
| 5,801,832 A | 9/1998 | Van Den Brink | |
| 6,020,964 A | 2/2000 | Loopstra et al. | |
| 6,046,792 A | 4/2000 | Van Der Werf et al. | |
| 6,134,007 A | 10/2000 | Naraki et al. | |
| 6,201,609 B1 | 3/2001 | Hill et al. | |
| 6,208,424 B1 | 3/2001 | de Groot | |
| 6,236,507 B1 | 5/2001 | Hill et al. | |
| 6,271,923 B1 | 8/2001 | Hill | |
| 6,304,318 B1 | 10/2001 | Matsumoto | |
| 6,313,918 B1 | 11/2001 | Hill et al. | |
| 6,541,759 B1 | 4/2003 | Hill | |
| 2003/0053074 A1 * | 3/2003 | Hill | 356/500 |

FOREIGN PATENT DOCUMENTS

| | | |
|---|---|---|
| JP | 7-351078 | 12/1995 |
| JP | 8-117083 | 4/1996 |
| JP | 10 260009 | 9/1998 |

OTHER PUBLICATIONS

Badami, V.G. et al. "Investigation of Nonlinearity in High Accuracy Heterodyne Laser Interferometry." *American Society for Precision Engineering 1997 Proceedings*, 16:pp. 153–156, 1997.

Bennett, S.J. "A Double–Passed Michelson Interferometer." *Optics Communications*, 4:6, pp. 428–430, 1972.

(List continued on next page.)

*Primary Examiner*—Zandra V. Smith
*Assistant Examiner*—Andrew H. Lee
(74) *Attorney, Agent, or Firm*—Fish & Richardson P.C.

(57) ABSTRACT

Beam shear can be reduced in an interferometric system by conditioning an input beam prior to directing the input beam to an interferometer. Accordingly, apparatus and methods for conditioning an interferometer input beam are disclosed.

80 Claims, 22 Drawing Sheets

OTHER PUBLICATIONS

Bobroff, Norman. "Recent advances in displacement measuring interferometry." *Meas. Sci. Technol,* 4: pp. 907–926, 1993.

Hines, Brad et al. "Sub–Nanometer Laser Metrology—Some Techniques and Models." *European Southern Observatory, ESO Conference,* pp. 1195–1204, 1991.

Oka, K. et al. "Polarization heterodyne interferometry using another local oscillator beam." *Optics Communications,* 92:pp 1–5, 1992.

Wu, Chien–Ming. Analytical modeling of the periodic nonlinearity in heterodyne interferometry. *Applied Optics,* 37:28 pp. 6696–6700, 1998.

* cited by examiner

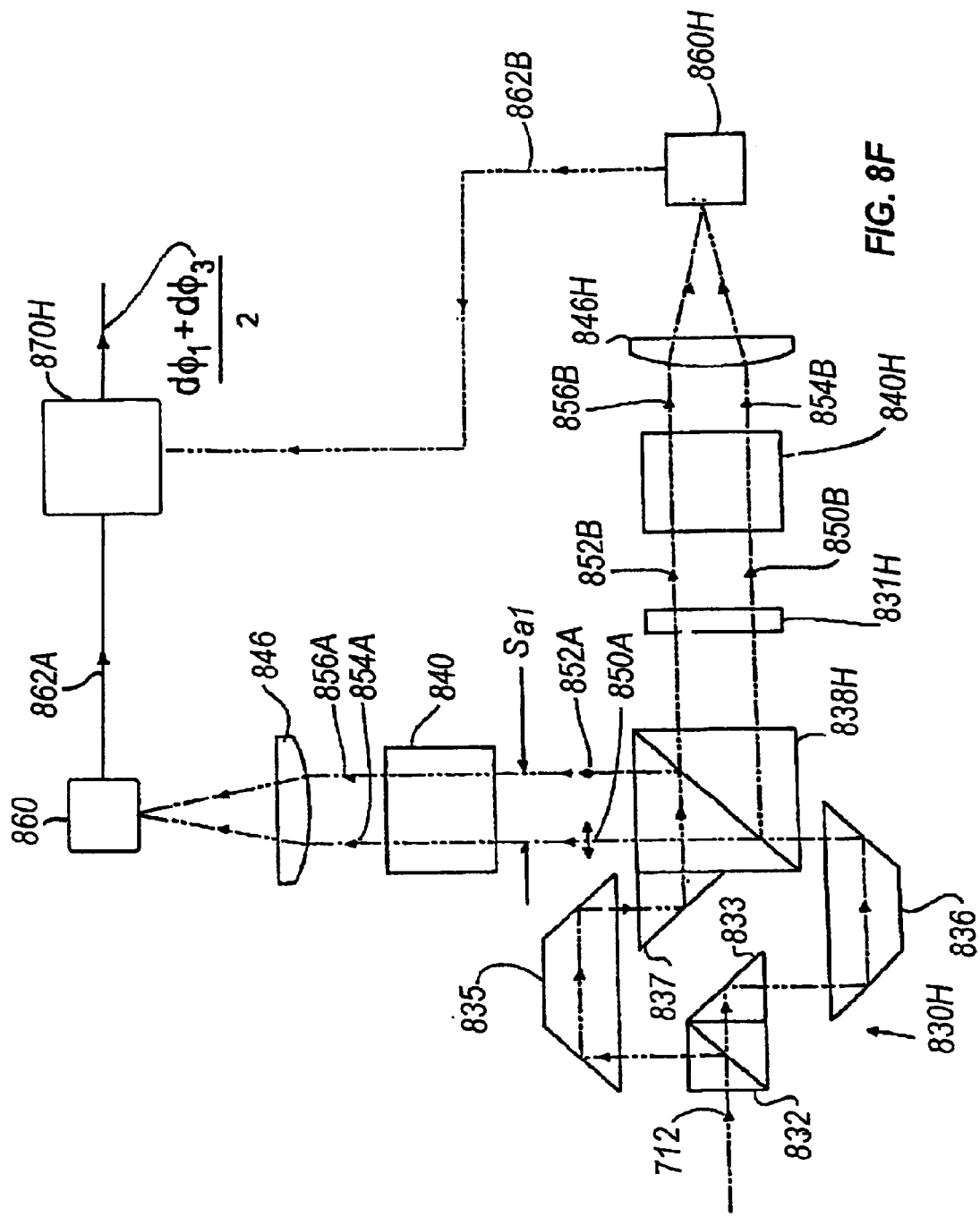

PASSIVE ZERO SHEAR INTERFEROMETERS

CROSS-REFERENCE TO RELATED APPLICATIONS

This application claims priority under 35 USC §119(e) to the following Provisional Patent Applications: Provisional Patent Application No. 60/309,608, filed on Aug. 2, 2001, entitled "PASSIVE ZERO SHEAR INTERFEROMETERS," to Henry A. Hill; Provisional Patent Application No. 60/314,345, filed on Aug. 23, 2001, entitled "PASSIVE ZERO SHEAR INTERFEROMETERS USING ANGLE SENSITIVE BEAM-SPLITTERS," to Henry A. Hill; and Provisional Patent Application No. 60/314,569, filed on Aug. 23, 2001, entitled "ZERO SHEAR NON-PLANE MIRROR INTERFEROMETER," also to Henry A. Hill. The entire contents of these provisional patent applications are hereby incorporated by reference.

BACKGROUND

This invention relates to interferometers, e.g., displacement measuring and dispersion interferometers that measure angular and linear displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the relative position of the measurement object correspond to changes in the phase of the measured interference signal, with a $2\pi$ phase change substantially equal to a distance change $L$ of $\lambda/(np)$, where $L$ is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-linearities" such as those caused by a change in lateral displacement between the reference and measurement beam components of an output beam of an interferometer when the wavefronts of the reference and measurement beam components have wavefront errors. The lateral displacement between the beam components is also referred to as "relative beam shear" or "differential beam shear." Relative beam shear causes non-cyclic, non-linearities for the following reasons.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems relative beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the relative beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the relative beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

Note that in addition to "relative beam shear," one can also refer to "absolute beam shear" or "common mode shear," which refer to a change in the lateral position of a beam as a whole. For example, in some interferometric arrangements the beam as a whole (including both reference and measurement components) may undergo a change in its lateral position ("absolute beam shear") in response to a change in the orientation of a measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

SUMMARY

Beam shear (e.g., relative beam shear) can be reduced (e.g., eliminated) in an interferometric system by conditioning an input beam prior to directing the input beam to the interferometer. Accordingly, the invention features apparatus and methods for reducing beam shear in an interferometer and/or for reducing beam shear in an output beam of an interferometer. Conditioning the input beam reduces beam shear associated with changes in the position (e.g., orientation and/or displacement relative to a reference frame) of a measurement object (e.g., plane mirror or retroreflector). Conditioning the input beam refers to adjusting the relative direction of propagation and/or location of the beam relative to a reference beam path to compensate for changes in the beam's path in the interferometer that are introduced by changes in the measurement object position. Conditioning of the input beam can be achieved passively.

Embodiments of the invention typically include a section that conditions properties of an input beam to form a conditioned input beam, which is then directed to an interferometer. The interferometer splits the conditioned input beam into a measurement beam and a reference beam. The beam conditioning section can include components that compensate for changes in the propagation of the measurement beam that would be caused by changes in the orientation of the measurement object. The beam conditioning section can also include components that compensate for absolute beam shear that may be introduced during the beam conditioning to minimize absolute shear of the conditioned input beam at the interferometer.

Other beams can be derived from the conditioned input beam prior to the interferometer. For example, a portion of the conditioned input beam can be directed to a reference detector for determining a reference phase. Alternatively, or additionally, a portion of the conditioned input beam can be directed to an angle interferometer. Angle interferometers can be used to monitor changes in the direction of propagation of the conditioned input beam relative to an optical axis defined by the beam conditioning portion.

For embodiments in which the measurement object is a plane mirror, conditioning the input beam causes the measurement beam to have a direction of propagation that is substantially orthogonal to the reflecting surface of the plane mirror for a range of orientation angles. As the orientation of the measurement object varies within this range of angles, beam conditioning ensures that the measurement beam retains normal incidence at the measurement object. Accordingly, shear between the reference and measurement components both within the interferometer and in the output beam that could result from such changes in measurement object orientation is reduced.

In addition, the reference and measurement beam components of the conditioned input beam have substantially zero shears at the input of one or more interferometers used to measure changes in the position of the measurement object. In other words, the absolute beam shear of the conditioned input beam entering the interferometer can be substantially zero despite changes in the orientation position of the measurement object.

The measurement object can be used as an integral part of the apparatus in conditioning the input beam to form the conditioned input beam. The input beam is typically directed to contact the measurement object at least once in the conditioning portion of the apparatus. In heterodyne interferometry, both components of the input beam are directed to contact measurement object. Accordingly, any change in the position of the measurement object from a reference position causes a change in the propagation direction/beam location relative a path defined by the reference position.

In general, in one aspect, the invention features an interferometry system, including a beam conditioning assembly positioned to direct an input light beam to reflect from a measurement object and derive a conditioned beam from the input beam after it reflects from the measurement object. The interferometry system also includes an interferometer positioned to receive the conditioned beam. During operation the interferometer splits the conditioned beam into a measurement beam and at least one other beam, directs the measurement beam to reflect from the measurement object, and overlaps the measurement beam after it reflects from the measurement object with the other beam to form an output beam.

Implementations of the invention may include one or more of the following features.

The measurement object can include a plane mirror. During operation the beam conditioning assembly can cause the measurement beam to be orthogonal to the plane mirror for a range of orientations of the plane mirror. Furthermore, the beam conditioning assembly can include an optical system that directs the input beam to reflect from the plane mirror to cause a change in propagation direction of the conditioned beam in response to a change in the angular orientation of the plane mirror with respect to the input beam. The optical system can include a single pass interferometer or some alternative device that causes the input beam to contact the plane mirror once. The beam conditioning assembly can further include an afocal system that scales the change in the propagation direction of the conditioned beam by an amount related to a magnification factor of the afocal system. In some embodiments, the magnification factor is 2. The beam conditioning assembly can further include an image inverter positioned to invert the change in the propagation direction, and thereby cause the measurement beam to be orthogonal to the plane mirror for a range of orientations of the plane mirror.

During operation the beam conditioning assembly can further shear the input beam to reduce the absolute shear of the conditioned beam entering the interferometer. For example, the beam conditioning assembly can shear the input beam in response to a change in the angular orientation of the plane mirror with respect to the input beam, thereby reducing any absolute shear of the output beam. To accomplish this, in some embodiments the beam conditioning assembly can further include a double pass optical system that causes the input beam to reflect from the plane mirror twice.

The double pass optical system can include an etalon oriented relative to a preselected orientation of the plane mirror so that the etalon substantially transmits the input beam and substantially reflects a first intermediate beam corresponding to the input beam once-reflected from the plane mirror. Furthermore, the etalon can substantially transmit a second intermediate beam corresponding to the input beam twice-reflected from the plane mirror.

Alternatively, or additionally, the double pass optical system can include a double pass interferometer positioned to direct an input beam having a first polarization state to contact the plane mirror twice. The double pass optical system further can include a first polarizing beam splitter and a first waveplate. The first polarizing beam splitter and first waveplate receive the input beam, split the input beam into a first component having the first polarization state and a second component, and rotate a polarization state of the second component to be substantially parallel to the first polarization state, and further direct the first and second components towards the double pass interferometer.

In conjunction with the double pass optical system, the beam conditioning assembly can include a second afocal system. During operation the second afocal system changes the absolute beam shear of the twice-reflected input beam by an amount related to a magnification factor of the afocal system. In some embodiments, the magnification factor is 0.5.

In some embodiments, the beam conditioning assembly can include a first optical system that causes the measurement beam to be orthogonal to the plane mirror for a range of orientations of the plane mirror and a second optical system that reduces shear of the conditioned input beam entering the interferometer. The beam conditioning system can direct the input beam to the second optical system and then to the first optical system. The first optical system can cause the input beam to contact the plane mirror an odd number of times. The first optical system can include a single pass plane mirror interferometer. The first optical system can further include an afocal system that scales a change in a propagation direction of the conditioned beam by an amount related to a magnification factor of the afocal system. The first optical system can further include an image inverter positioned to invert a change in a propagation direction of the conditioned beam. The second optical system can cause the input beam to contact the plane mirror an even number of times. The second optical system can include a double pass plane mirror interferometer. The second optical system can further include an afocal system that changes a shear of the conditioned beam.

In some embodiments, the measurement object is a retroreflector. The beam conditioning assembly can include an afocal system and relay optics. The retroreflector can direct the input beam towards the afocal system that changes a shear of the conditioned beam by an amount related to a magnification factor of the afocal system. The beam conditioning assembly can reduce shear between the measurement beam and the at least one other beam in the output beam for a range of orientations and positions of the retroreflector. The interferometer can be a single pass interferometer.

The interferometry system can include a light source positioned relative to the beam conditioning assembly so that during operation the light source directs the input beam toward the beam conditioning assembly. The input beam can include first and second components having respective first and second frequencies and polarization states, wherein the first and second frequencies are different and the first and second polarization states are orthogonal.

Furthermore, the interferometry system can include a detector positioned to receive the output beam from the interferometer.

The interferometry system can also include a reference detector positioned to receive a reference beam derived from the conditioned beam.

In some embodiments, the interferometry system can include a second interferometer positioned to receive a secondary beam derived from the conditioned beam. During operation the second interferometer splits the secondary beam into a secondary measurement beam and at least one other beam and directs the secondary measurement beam toward the measurement object, and overlaps a reflected secondary measurement beam and the other beam to form a secondary output beam.

The interferometry system can include an angle measuring interferometer positioned to receive a conditioned angle measurement beam derived from the conditioned beam or the measurement beam. During operation the angle measuring interferometer can split the conditioned angle measurement beam into first and second components, can direct the first and second components along first and second paths, and can overlap the first and second components at a detector. The overlapping first and second components can cause the detector to generate an interference signal related to a propagation direction of the conditioned angle measurement beam. The interference signal can be related to the orientation of the measurement object.

The angle measuring interferometer can include an etalon and transmission of the conditioned angle measurement beam through the etalon can be related to a propagation direction of the conditioned angle measurement beam.

In another aspect, the invention features a lithography system for fabricating integrated circuits including first and second components, the first and second components being movable relative to one another. The lithography system further includes the interferometry system according to the above-described first aspect, secured to the second component. The measurement object is rigidly secured to the first component and during operation the interferometry system measures the position of the first component relative to the second component.

One of the first and second components can be a movable stage which during operation supports a wafer.

In general, in another aspect, the invention features an interferometry method. The interferometry method includes deriving a conditioned beam from an input beam by directing the input beam to contact a measurement object at least once, splitting the conditioned beam into a measurement beam and at least one other beam, directing the measurement beam to reflect from the measurement object at least once, and overlapping the reflected measurement beam and the at least one other beam to form an output beam.

Embodiments of the method can include one or more of the following features.

The conditioned beam can be derived to reduce a shear between the overlapping reflected measurement beam and the at least one other beam in the output beam for a range of positions of the measurement object.

The measurement object can be a plane mirror. The measurement beam can be orthogonal to the plane mirror for a range of incident angles of the input beam on the plane mirror. Deriving the conditioned beam can include directing the input beam to reflect from the plane mirror to change a propagation direction of the measurement beam in response to a change in the angular orientation of the plane mirror with respect to the input beam. Deriving the conditioned beam can also include directing a reflected input beam through an afocal system to scale the change in propagation direction by an amount related to a magnification factor of the afocal system. Furthermore, deriving the conditioned beam can include directing the reflected input beam through an image inverter to invert the change in propagation direction to cause the measurement beam to be orthogonal to the plane mirror for a range of orientations of the plane mirror. Deriving the conditioned beam can also include shearing the reflected input beam in response to changes in the orientation of the plane mirror with respect to the input beam, and can include directing the sheared input beam through a second afocal system to scale the shear by an amount related to a magnification of the second afocal system. The reflected input beam can be sheared to reduce the absolute shear of the conditioned beam entering the interferometer.

The interferometry method can include detecting an intensity of the output beam.

In some embodiments, the measurement object is a retroreflector.

The interferometry method can also include deriving a conditioned angle measurement beam from the output beam or measurement beam and directing the conditioned angle measurement beam to an angle measuring interferometer. The angle measuring interferometer can split the conditioned angle measurement beam into first and second components, can direct the first and second components along first and second paths, and can overlap the first and second components at a detector. The overlapping first and second components can cause the detector to generate an interference signal related to a propagation direction of the conditioned angle measurement beam. The interference signal can be related to the orientation of the measurement object.

The input beam can contact the measurement object an odd number of times (e.g., three times).

The measurement beam can contact the measurement object an odd number of times (e.g., once). Alternatively, the measurement beam can contact the measurement object an even number of times (e.g., twice).

In general, in another aspect, the invention features an interferometry system, which includes a beam conditioning assembly positioned to direct an input light beam to reflect from a measurement object and derive a conditioned beam from the input beam after it reflects from the measurement object. The interferometry system also includes an interferometer positioned to receive the conditioned beam and split the conditioned beam into a measurement beam and at least one other beam, the interferometer directs the measurement beam to reflect from the measurement object, and overlaps the measurement beam after it reflects from the measurement object with the other beam to form an output beam, wherein for a range of orientations of the measurement object the beam conditioning assembly causes the measurement beam to be orthogonal to the measurement object.

Embodiments can include one or more of the features according to systems and methods described above.

Embodiments of the invention may have one or more of the following advantages.

The "common mode" beam shear in the passive zero-shear interferometer (PZSI) at the input of the one or more interferometers can be approximately two orders of magnitude smaller than that present in a standard HSPMI. The maximum common mode beam shear in the interferometer can be 20 to 40 microns.

There can be reduced "differential mode" beam shear between the reference and measurement beams at a distance or angle measuring interferometer of a PZSI. For example, there can be no differential mode beam shear between reference and measurement beams at a distance or angle measuring interferometer of a PZSI for a range of positions of the measurement object relative the interferometer. The maximum differential mode beam shear in the input of the one or more interferometers can be less than or of the order of 5 microns.

There can be reduced differential mode beam shear (e.g., substantially no differential mode beam shear) between the reference and measurement beams at the detector of a PZSI. The maximum differential mode beam shear at the detector can be less than or of the order of 5 microns. This feature can simplify fiber-optic pickup (FOP) vis-à-vis non-linear non-cyclic errors for use of both single mode and multi-mode fiber optics. This feature can also reduce (e.g., eliminate), by two or more orders of magnitude, the non-linear non-cyclic errors caused by beam shear and wavefront errors that are introduced by elements of the interferometer excluding the measurement object. The non-linear non-cyclic error caused a wavefront error introduced by the measurement object can be reduced by a factor of four or more depending upon the spatial properties of the wavefront error. Reduction of the differential mode beam shear in the PZSI can permit use of smaller diameter beams in the presence of relatively large changes in orientation of the measurement object mirror. The reduction of the differential mode beam shear in the PZSI can relax optical tolerances on interferometer and detector elements required to achieve a specified level of system performance.

The measurement beam in a PZSI can be always normal to the reflecting surface of a measurement object mirror, for at least a range of orientation angles of the measurement object mirror.

There can be no moving parts, i.e., no dynamic elements, in a PZSI.

The PZSI can be configured to operate as a single pass plane mirror interferometer (SPPMI). The PZSI SPPMI can have a reduced number of sources of cyclic error. Alternatively, the PZSI can be configured to operate as a double pass plane mirror interferometer (DPPMI) or as a multi-pass plane mirror interferometer (MPPMI) where the number of passes is three or more.

Sub-harmonic cyclic errors present in multiple pass interferometers of the pitch-yaw-displacement (PYD) section of a PZSI can be eliminated by a rotation of the PZSI or rotation of certain elements of the PZSI.

Effects of birefringence in a PZSI can be eliminated by incorporation of birefringent prism(s), as described in Provisional Application Serial No. 60/303,299 entitled "Interferometry System and Method Employing an Angular Difference in Propagation between Orthogonally Polarized Input Beam Components" by Peter de Groot and Henry A. Hill filed Jul. 6, 2001, the contents of which are incorporated herein by reference.

The beam shear at the measurement object mirror in a PZSI can be ¼ of the beam shear generated by the second pass beam to the measurement object mirror in a double pass plane mirror interferometer, e.g., a HSPMI.

The measurement object (e.g., measurement object mirror) can be smaller when using a PZSI. Similarly, the interferometer components in a PZSI can be smaller.

The interference signal amplitude in a PZSI can be independent of pitch and yaw for the SPPMI, DPPMI, and MPPMI systems. This feature can improve efficiency of the interferometer system with respect to laser beam intensity by a factor of 2 to 3. The factor may be even larger when considering properties of a standard HSPMI in the context of a large maximum beam shear such as 4 mm.

A SPPMI can be used with passive angle interferometers, i.e., angle detectors that have no moving parts. Examples of passive angle interferometers are those developed for the dynamic interferometer to measure PYD based on a single measurement beam contacting the measurement object mirror.

The surface properties of measurement object mirrors can be characterized in-situ in a litho-tool configured with a metrology system based on SPPMI's and no additional reference flats are required.

The PZSI's can be placed on a moving stage with the measurement object mirrors located off the stage.

A PZSI can be aligned at the factory with no additional alignment of the PZSI required in the field.

The passive zero-shear feature of the PZSI cited with respect to a zero relative shear of output reference and measurement beams also means that portions of the input reference and measurement beams conjugate to the reference and measurement output beams, respectively, exhibit no lateral shear (this is not necessarily the case for example with a HSPMI used with a measurement object mirror that experiences changes in orientation).

The details of one or more embodiments of the invention are set forth in the accompanying drawings and the description below. Other features, objects, and advantages of the invention will be apparent from the description and drawings, and from the claims.

DESCRIPTION OF DRAWINGS

The invention will now be further described merely by way of example with reference to the accompanying drawings in which:

FIGS. 8a–8f are schematic diagrams of embodiments of angle interferometers.

Like reference symbols in the various drawings indicate like elements.

DETAILED DESCRIPTION

Interferometry systems that provide such features will now be described generally, and thereafter, more specific embodiments will be described in greater detail.

Figure 1:
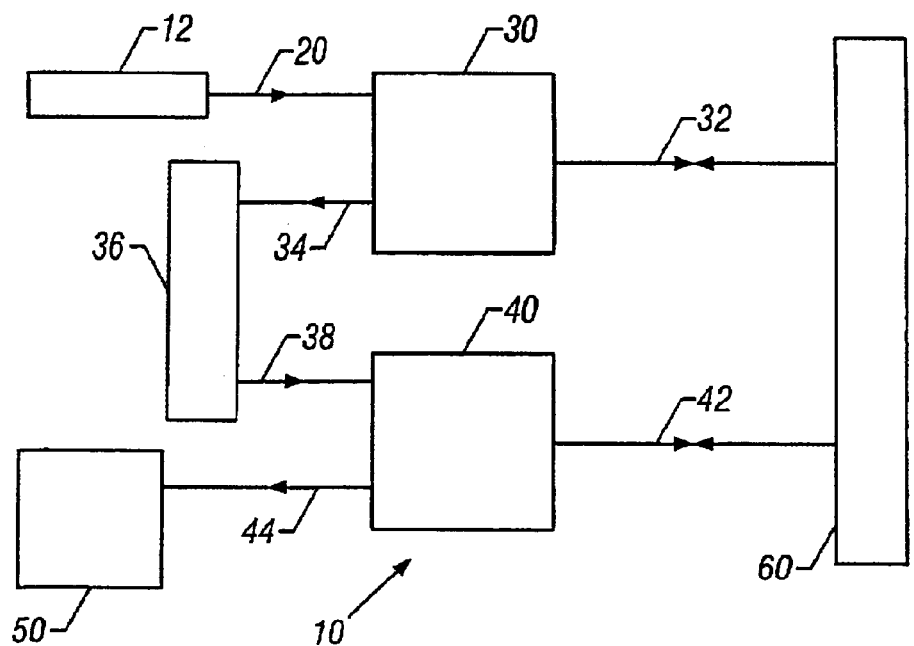
FIG. 1 is a general, schematic diagram of an interferometry system of the present invention.

Referring to FIG. 1, an interferometry system 10 includes a source 12; a beam conditioner 30; an optical relay system 36; interferometer system 40, detector 50, and measurement object mirror 60. Source 12 includes a laser for providing one or more beams 20 to interferometer system 10. For dispersion interferometry, beams 20 include at least two beams at different wavelengths, e.g., 1064 nm and 532 nm. For optical path displacement measurements, a single wavelength is sufficient. When using heterodyne interferometry techniques at one or more different wavelengths, source 12 introduces a frequency splitting between components of each beam at the one or more different wavelengths. For example, one or more acousto-optical modulators can be used to introduce the frequency splitting, or alternatively, the source can include a Zeeman-split laser to produce the frequency splitting. Often the frequency-split components are made to have orthogonal polarizations. The frequency-split components can be sent to interferometer system 10, where they are separated into measurement and reference beams. Alternatively, source 12 can spatially separate the frequency-split components and send the spatially separated components to interferometer system 10, where they become measurement and reference beams.

Interferometer system 40 can be any type of interferometer, e.g., a differential plane mirror interferometer, a double-pass interferometer, a single pass plane mirror interferometer such as described herein with respect to an embodiment of the present invention or a Michelson-type interferometer. Interferometer system 40 can be designed to monitor, for example, changes in optical path length, changes physical path length, changes in refractive index, changes in wavelength of a beam, or intrinsic gas properties along a path length. Interferometer system 40 directs one or more reference beams along corresponding reference paths (which may contact corresponding reference objects) and a corresponding measurement beams along corresponding measurement paths contacting a measurement object at one or more spots (e.g., an extended mirror on a lithography stage), and then combines the corresponding reference and measurement beams to form overlapping pairs of exit beams 44. In dispersion interferometry applications, there are overlapping pairs of exit beams for each of the different wavelengths. In applications measuring changes in distance to an object mirror and changes in orientation of the measurement object mirror, there are overlapping pairs of exit beams for each of the linear and/or angular displacements being measured.

The interference between the overlapping pairs of exit beams contains information about the relative difference in optical path length between the corresponding reference and measurement paths. In some embodiments, the reference paths are fixed and therefore changes in the optical path length differences correspond to changes in the optical path length of the corresponding measurement paths. In other embodiments, however, the optical path length of both the reference and measurement paths can be changing. For example, a reference path can contact a reference object (e.g., a column reference), that may move relative to the interferometer system 40. In this latter case, the changes in the optical path length difference correspond to changes in the position of the measurement object relative to the reference object.

When the reference and measurement beams have orthogonal polarizations, the intensity of at least one intermediate polarization of the overlapping pair of exit beams is selected to produce the optical interference. For example, a polarizer can be positioned within interferometer 40 to mix the polarizations of the overlapping pair of exit beams, which is then sent to detector 50 as a mixed beam 44. Alternatively, the polarizer can be positioned within detector 50. Detector 50 measures the intensity of the selected polarizations of the overlapping pairs of exit beams to produce the interference signals. Portions of the beams can be combined with one another before being directed along the reference and measurement paths to provide a reference pair of overlapping exit beams, which is used to provide a reference interference signal.

Detector 50 includes photodetectors, which measure the intensities of the selected polarizations of the overlapping pairs of exit beams, and electronics such as a preamplifiers and an analog-to-digital converters, which amplify the output from the photodetectors and produce digital signals corresponding to the optical interferences. In dispersion interferometry applications for example, digital signals are produced for each of the overlapping pair of exit beams (which correspond to different wavelengths) by using multiple photodetection channels within detector 50.

Figure 2B:
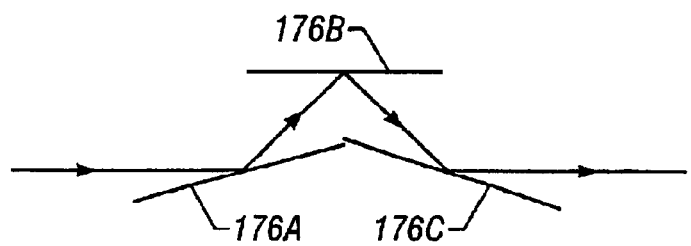
FIGS. 2a–2f are schematic diagrams of a first embodiment of the invention.
Figure 2C:
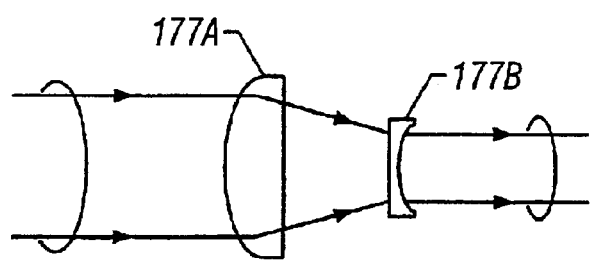
Figure 2A:
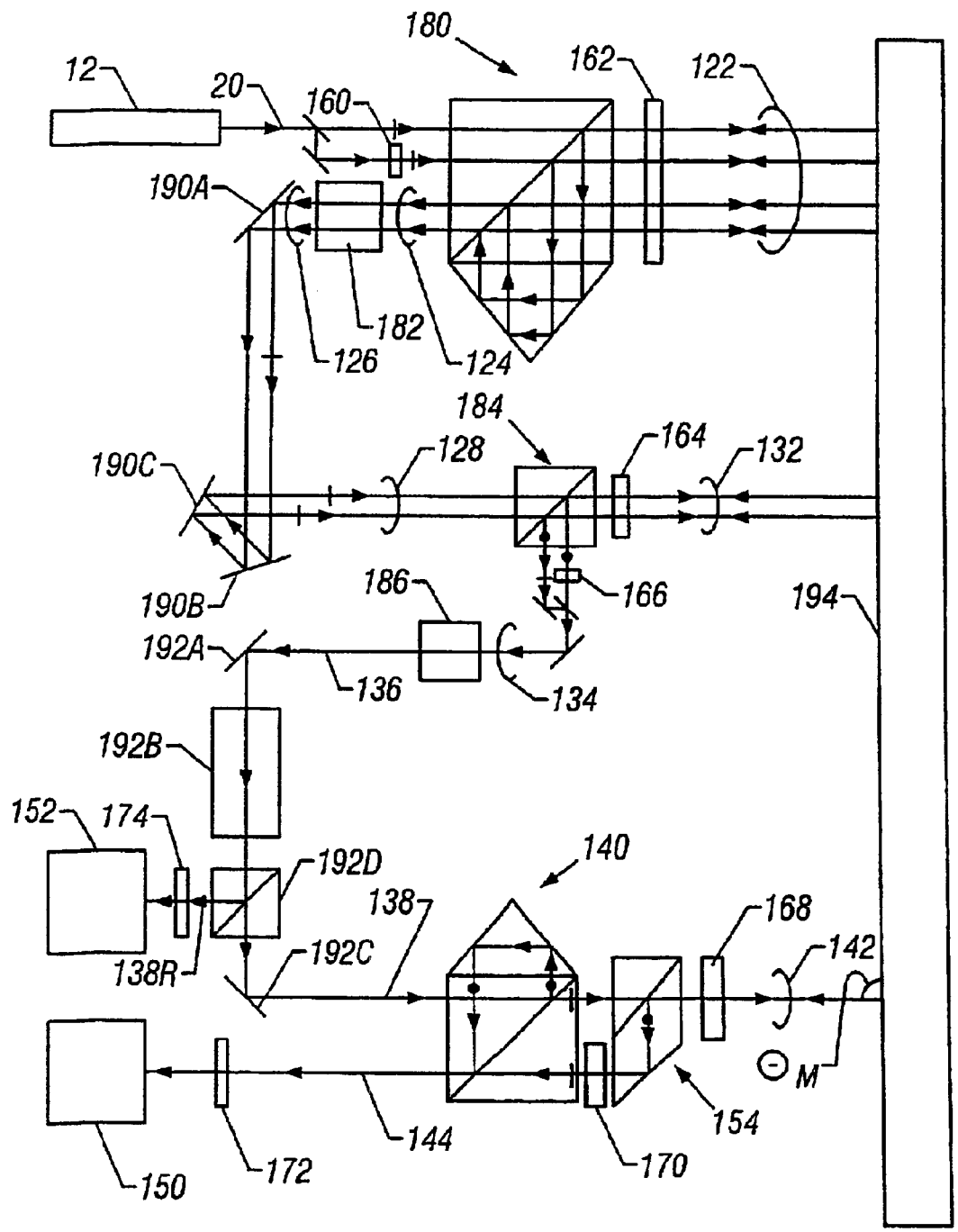

The first embodiment of the present invention is shown diagrammatically in FIG. 2a. The beam conditioner of the first embodiment comprises a differential plane mirror interferometer shown generally at 180 wherein plane mirror 194 serves as both the reference and measuring objects. The beam conditioner further comprises a single pass plane mirror interferometer generally shown at 184 wherein the reference and measurement objects are also plane mirror 194. The remaining components of the beam conditioner are afocal systems 182 and 186 and beam relay system comprising elements 190A, 190B, and 190C.

The description of source 12 and input beam 20 of the first embodiment is the same as the description given for the corresponding elements shown in FIG. 1. Input beam 20 is incident on interferometer 180 to form beam 122 and output beam 124. Beam 122 comprises both reference and measurement beams that each makes a double pass to mirror 194. Elements 160 and 162 are half wave and quarter wave phase retardation plates, respectively.

Output beam 124 comprises spatially separated reference and measurement output beam components. Output beam 124 is transmitted by afocal 182 to form demagnified beam 126. Directions of propagation of components of output beam 124 and demagnified beam 126 relative to the direction of propagation of input beam 20 are independent of any change in orientation of mirror 194. This is a direct consequence of the double pass of both the reference and measurement beams to mirror 194. However, there are lateral shears of the components of output beam 124 and demagnified beam 126 that result from a change in orientation of mirror 194. The magnitudes $S_1$ and $S_2$ of the lateral shear vectors representing the shears of beam 124 and beam 126, respectively, are $$S_1 = 4\alpha L,$$

$$S_2 = \eta_1 4\alpha L \qquad (1)$$

where $\alpha$ is the change in angular orientation of mirror 194 from an orientation at which beam 122 is normally incident on mirror 194, $\eta_1$ is the demagnification factor describing the demagnification introduced by afocal system 182, and L is a physical path length associated with beam 122. The magnitude of length L is nominally the distance between the reflecting surface of mirror 194 and the nodal point of the retroreflector in interferometer 180 measured in a direction parallel to the direction of propagation of input beam 20. The change in angular orientation of mirror 194 comprises the net effect of changes in pitch and yaw. The directions of the lateral shear vectors are in the plane of FIG. 2a for a change in yaw and perpendicular to the plane of FIG. 2a for a change in pitch.

Demagnified beam 126 is incident on beam relay system comprising elements 190A, 190B, and 190C and exits as beam 128. The reflecting properties of the beam relay system are equivalent to those of a single reflecting surface such that the direction of propagation of beam 128 is parallel to the direction of propagation of beam 124. In addition, the lateral shear of beam 128 resulting from a change in orientation of mirror 194 is the same as the corresponding lateral shear of beam 126.

Beam 128 is incident on a single pass interferometer generally shown at 184 in FIG. 2a. The reflecting surface of mirror 194 serves as the reference and measurement objects for interferometer 184. Beam 132 comprises both reference and measurement beams that contact mirror 194 and output beam 134 is the output beam of interferometer 184.

Output beam 134 is transmitted by afocal system 186 as magnified beam 136. Changes in directions of propagation of components of output beam 134 and magnified beam 136 are $2\alpha$ and $2\alpha/\eta_2$, respectively, with respect to the direction of propagation of beam 128 where $\eta_2$ is the magnification factor of afocal system 186. For the value of $\eta_2=2$, the direction of propagation of magnified beam 136 relative to a vector orthogonal to the reflecting surface of mirror 194 is independent of any change in orientation of mirror 194. The magnitudes of the lateral shear vectors $S_3$ and $S_4$ representing the shears of beam 134 and beam 136, respectively, are $$S_3 = (4\eta_1 - 2)\alpha L,$$

$$S_4 = \eta_2(4\eta_1 - 2)\alpha L. \qquad (2)$$

Because of the factor $(4\eta_1 - 2)$ in Eqs. (2), the magnitudes of lateral shears $S_3$ and $S_4$ are zero for the demagnification factor $$\eta_1 = 0.5. \qquad (3)$$

Thus for $\eta_1 = 0.5$, there are substantially no lateral shears of the components of output beam 134 and magnified beam 136 that result from a change in orientation of mirror 194.

Next as shown in FIG. 2a, magnified beam 136 is incident on a second relay optical system comprising mirrors 192A and 192C and image inverter 192B. Non-polarizing beam splitter 192D does not alter the properties of the second relay optical system with respect to the relative directions of propagation of beams 136 and 138. The properties of the second relay optical system are the same as a polarization preserving retroreflector with regard to properties of the transmitted beam 138 relative to properties of incident beam 136. A polarization preserving retroreflector is the preferred form of retroreflector in order to eliminate a potential source of polarization mixing. Polarization preserving retroreflectors are described in U.S. Pat. No. 6,198,574 B1 by Henry Allen Hill entitled "Polarization Preserving Optical Systems," the contents of which are included herein in there entirety by reference. Polarization mixing generally will generate cyclic errors in changes in displacement of mirror 194 as measured by interferometer 140.

Image inverter 192B inverts the wavefront of beam 136 upon being transmitted by inverter 192B wherein the axis of the inversion is a line in the plane of FIG. 2a and that is perpendicular to the propagation direction of the beam. Image inverter 192B is shown schematically in FIG. 2b and comprises three mirrors 176A, 176B, and 176C. Other forms of image inverters known to one skilled in the art may be used for image inverter 192B without departing from the scope and spirit of the present invention. The plane of FIG. 2b is orthogonal to the plane of FIG. 2a. The function of image inverter 192B in the second relay system is to cause for a beam transmitted by inverter 192B a change in beam propagation direction in the plane of FIG. 2b that is opposite to the corresponding change in beam propagation direction in the plane of FIG. 2b of the corresponding beam incident on inverter 192B.

Beam 138 is incident of interferometer generally indicated at 140 in FIG. 2a and is transmitted as output beam 144. Interferometer 140 is a single pass interferometer wherein the measurement beam 142 makes a single pass to mirror 194. Elements 168 and 170 are quarter wave and half wave phase retardation plates, respectively, and element 154 comprises a polarizing beam splitter and a rhomb. Since a change in the angle of incidence of beam 138 on interferometer 140 is $\alpha$, the direction of propagation of beam 142 relative to a vector orthogonal to reflecting surface of mirror 194 is independent of changes of orientation of mirror 194. In addition, the direction of propagation of beam 142 may be aligned parallel to the vector, i.e., the angle of incidence $\theta_M$ (see FIG. 2a) of beam 142 on the reflecting surface of mirror 194 is 90 degrees, by an adjustment of, for example, the orientations of mirrors, such as mirror 192C, so that the direction of propagation of beam 142 is orthogonal to the reflecting surface of mirror 194 independent of changes of orientation of mirror 194. Since both the beam shear of beam 138 at interferometer 140 is substantially zero and the direction of propagation of beam 142 is always orthogonal to reflecting surface of mirror 194 independent of changes of orientation of mirror 194 for at least a range of angles, there is substantially no beam shear of output beam 144 associated with changes in orientation of mirror 194.

Beam shear of beams in an interferometer can generate non-cyclic non-linear errors in interferometrically measured changes in displacement of a measurement object. As a consequence of the substantially no beam shear of output beam 144 associated with changes in orientation of mirror 194, corresponding non-cyclic non-linear errors are substantially eliminated in displacements of mirror 194 measured by interferometer 140.

Output beam 144 is next transmitted by polarizer 172 to generate a mixed output beam and then detected by detector 150 to produce an electrical interference signal or heterodyne signal. Detector 150 is preferably a quantum photon detector. The phase of the heterodyne signal is subsequently determined by a phase meter (not shown in FIG. 2a) using a reference signal from source 12 (not shown in FIG. 2a). Changes in displacement of mirror 194 is inferred from the changes in the measured phase.

The relative phase of the reference and measurement beam components of beam 138 can exhibit changes due for example to turbulence in non-coextensive optical paths of progenitor beam components of beam 138 and to wavefront errors and beam shears generated by changes in orientation of mirror 194. These changes in phase, if not compensated, may be large enough for certain end use applications to produce unacceptable errors in measured changes in the relative phase of output beam 144. The errors that result from the changes in phase can be compensated by splitting off part of beam 136 transmitted by image inverter 192B as phase reference beam 138R by non-polarizing beam splitter 192D. Beam 138R is next transmitted by polarizer 174 to generate a mixed phase reference beam and then detected by detector 152 to produce a reference electrical interference signal or reference heterodyne signal. Detector 152 is preferably a quantum photon detector. The phase of the reference heterodyne signal is subsequently determined by a phase meter (not shown in FIG. 2a) using the reference signal from source 12 (not shown in FIG. 2a). The measured phase of the reference heterodyne signal is used to compensate for cited errors in measured phase of the heterodyne signal associated with output beam 144.

Afocal systems 182 and 186 may comprise afocal lenses and/or anamorphic afocal attachments [see, e.g., Chapter 2 entitled "Afocal Systems" by W. B. Wetherell in *Handbook Of Optics II*, Second Edition (McGraw-Hill)]. A first embodiment is shown diagrammatically for an afocal system such as represented by a Galilean afocal lens. However, a Keplerian afocal lens can be used. If a Keplerian afocal lens is used for one or more afocal systems, the transformation properties of corresponding relay lens systems must be changed to reflect the inverting features of the Keplerian afocal lens. The afocal systems may also comprise anamorphic afocal attachments based on cyclindrical lenses, prisms, and birefringent elements.

Figure 2D:
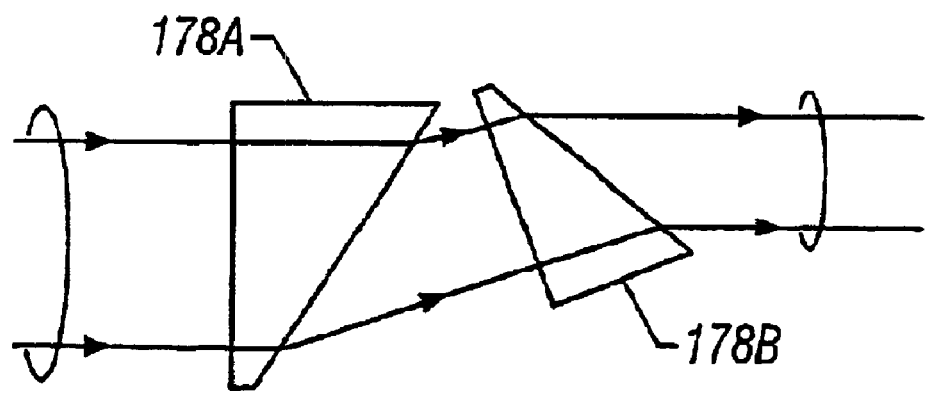
Figure 2E:
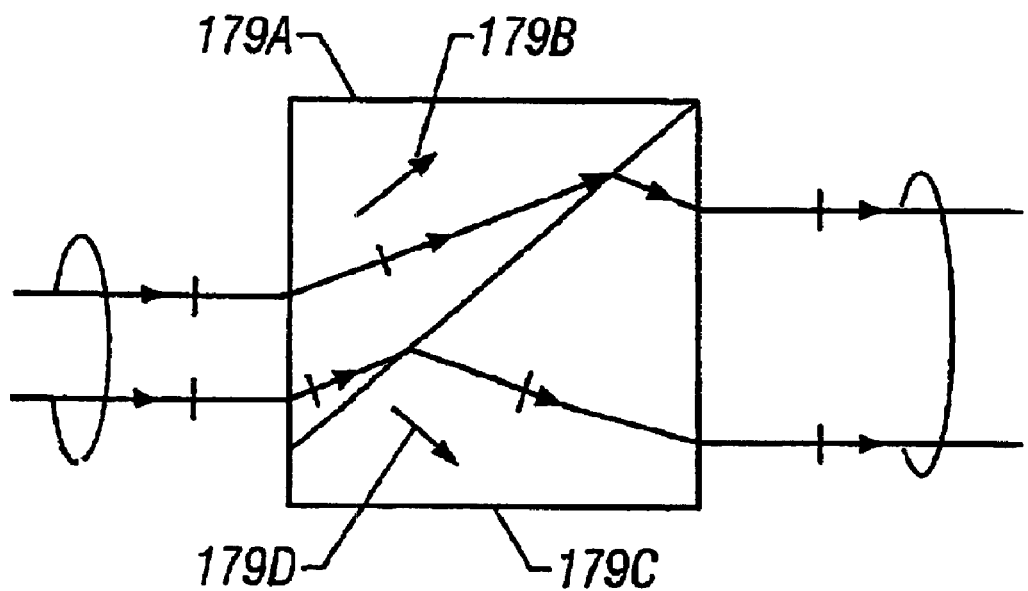

An example of a Galilean afocal lens is shown diagrammatically in FIG. 2c and a prismatic and birefringent anamorphic afocal attachments are shown diagrammatically in FIGS. 2d and 2e, respectively. The Galilean afocal lens shown in FIG. 2c comprises positive and negative lenses 177A and 177B, respectively, and illustrates its operation in a demagnifying mode.

A prismatic anamorphic afocal attachment, shown in FIG. 2d, comprises two prisms 178A and 178B and also illustrates its operation in a demagnifying mode.

A birefringent anamorphic afocal attachment, shown in FIG. 2e, comprises two birefringent prisms 179A and 179C bonded together and illustrates its operation in a magnifying mode. The birefringent prisms may comprise, for example, uniaxial crystals such as calcite and paratellurite. The optic axes for birefringent prisms 179A and 179C are shown in FIG. 2e as elements 179B and 179D, respectively. Polarization of the input beam is extraordinary. The path of the input beam through the birefringent anamorphic afocal attachment and the directions for the optic axes 179B and 179D are shown for a system comprising positive uniaxial crystals wherein the ordinary index of refraction is less than the extraordinary index of refraction.

Interferometers 180 and 184 are shown diagrammatically in FIG. 2a with the beam components of beam 122 and of beam 132 lying in the same plane to simplify the description of the operation of the present invention. The configuration of the first embodiment as shown in FIG. 2a has an advantage with respect to the minimum width required for the reflecting surface of mirror 194 in the dimension perpendicular to the plane of FIG. 2a. It will be evident to those skilled in the art that other configurations of interferometers 180 and 184 may be used wherein the beam components of beam 122 and of beam 132 comprise two or more planes parallel to the plane of FIG. 2a without departing from the spirit and scope of the present invention.

It will be further evident to those skilled in the art that other forms of double pass interferometers, such as a high stability plane mirror interferometer and/or a similar device such as is described in an article entitled "Differential interferometer arrangements for distance and angle measurements: Principles, advantages and applications" by C. Zanoni, *VDI Berichte* Nr. 749, 93–106 (1989), can be incorporated into the apparatus of the first embodiment of the present invention as when working with stages commonly encountered in the micro lithographic fabrication of integrated circuits without significantly departing from the spirit and scope of the present invention.

Figure 2F:
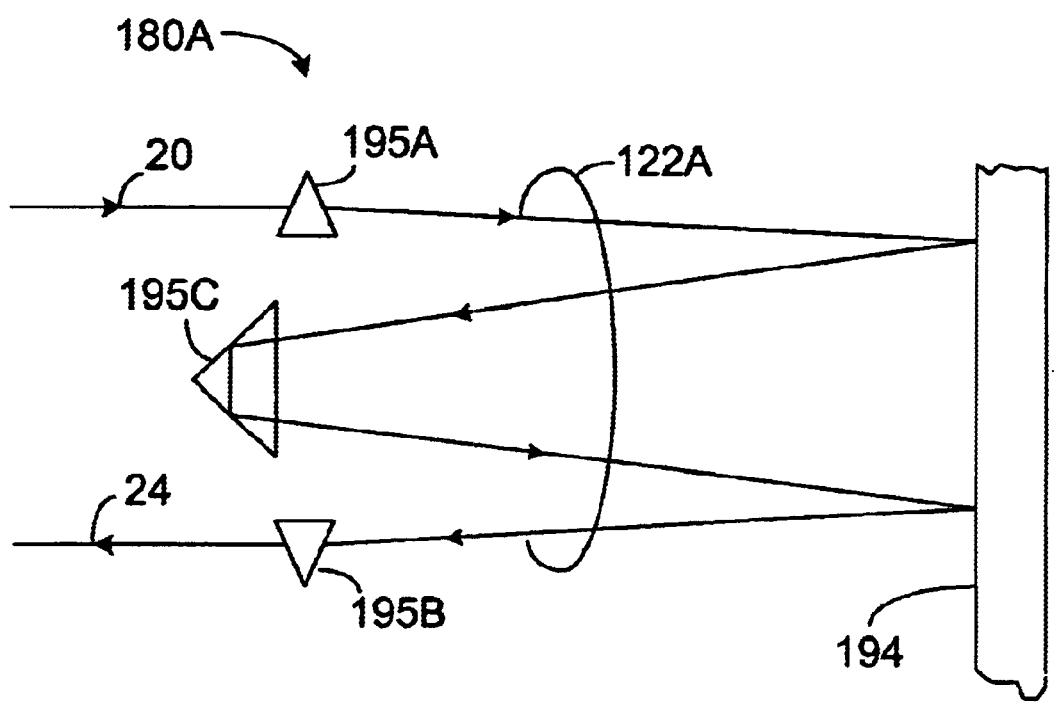

A variant of the first embodiment is described wherein interferometer 180 of the first embodiment is replaced by an optical system generally shown at number 180A in FIG. 2f. The remaining components and systems of the variant of the first embodiment are the same as the remaining components and systems of the first embodiment except for the omission of quarter wave and half wave phase retardation plates 160 and 162, respectively, and except where the reference and measurement beam is 122A in the variant.

Optical system 180A shown diagrammatically in FIG. 2f comprises prisms 195A and 195B and a polarization preserving system 195C. The beam components of reference and measurement beam 122A comprise coextensive reference and measurement beams along each section of optical paths contacting mirror 194. Also a polarizing beam splitter and the phase retardation plates 160 and 162 such as required in the first embodiment are not required in the variant to separate the beams returning from mirror 194 from beams sent to mirror 194 since the respective beams are spatially separated in the space of polarization preserving reflecting system 195C.

Polarization preserving system 195C is of the type described in U.S. Pat. No. 6,198,574 B1. The transformation properties of system 195C with respect to corresponding changes in directions of propagation of input and output beams to system 195C are such that the directions of propagation of coextensive reference and measurement beam components of beam 24 exiting prism 195B are parallel to the directions of propagation of coextensive reference and measurement beam components of beam 20 incident on prism 195A independent of changes in orientation of mirror 194. Alternatively, system 195C can be replaced by a polarization preserving retroreflector such as described in cited U.S. Pat. No. 6,198,574 B1 and two prisms that are the same as prisms 195A and 195B.

The input beam to system 195C experiences a shear as mirror 194 is translated longitudinally in a direction nominally orthogonal to the reflecting surface of mirror 194. Because of the transformation properties of system 195C, the output beam of system 195C experiences a shear that is the opposite to the shear of the input beam to system 195C. As a consequence of the relative inversion of the shears of the output beam relative to the input beam for system 195C, there is no shear of beam 24 that is introduced by a longitudinal translation of mirror 194.

The remaining description of the variant of the first embodiment is the same as corresponding portions of the description given for the first embodiment.

An advantage of the variant of the first embodiment is that beam 122A contacts mirror 194 at only two spots. Thus a smaller area of mirror 194 is required for the variant of the first embodiment as compared to the area required by the first embodiment.

Another advantage of the variant of the first embodiment is a reduced sensitivity to turbulence in a gas that may be in the optical path of beam 122A and reduced sensitivity of to wavefront errors introduced in optical system 180A. The reduced sensitivities are a consequence of substantially the common paths for the reference and measurement beams in optical system 180A.

Figure 3:
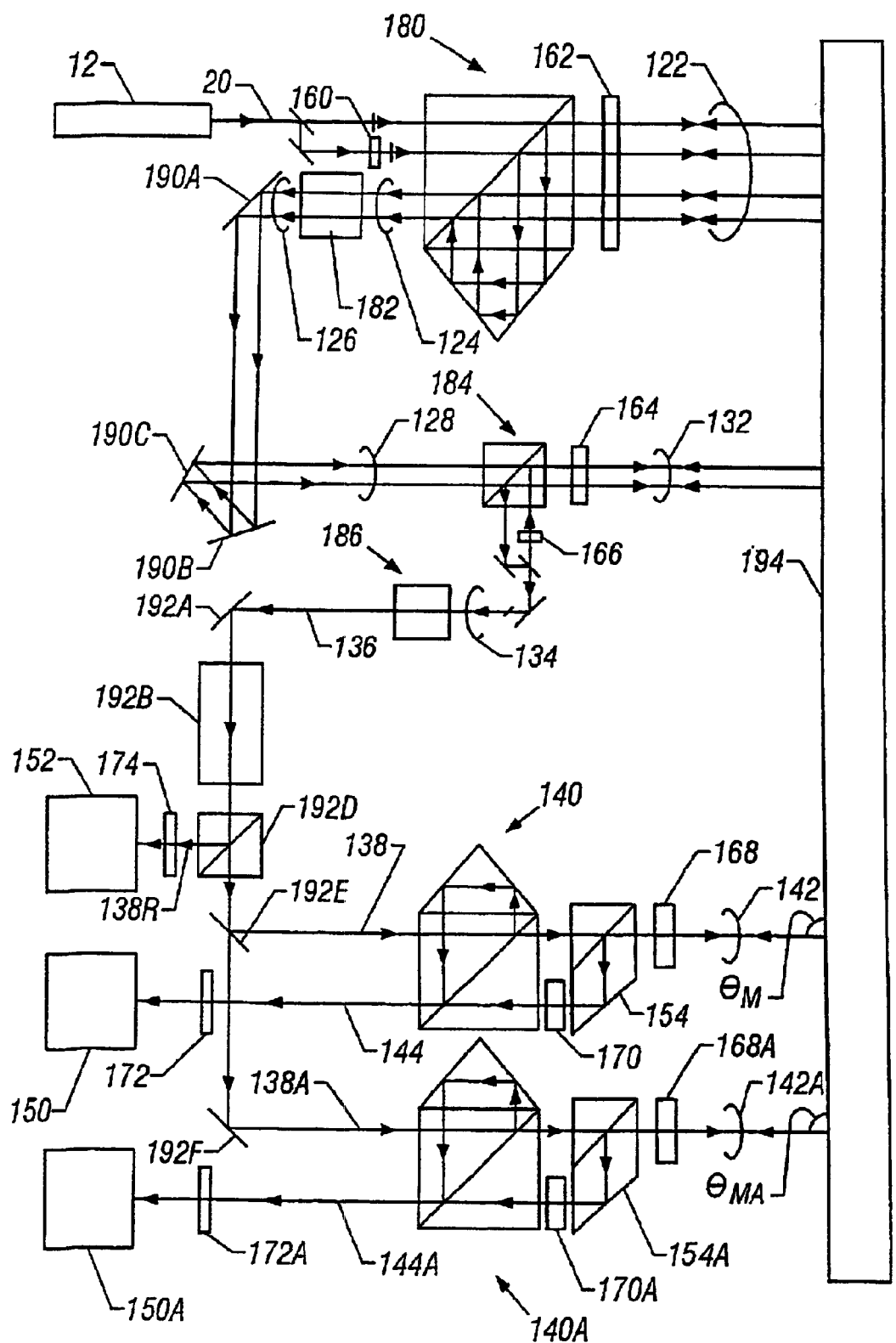
FIG. 3 is a schematic diagram of a second embodiment of the invention.

A second embodiment is shown diagrammatically in FIG. 3. The second embodiment comprises many elements with functions the same as like numbered elements of the first embodiment. The second embodiment of the present invention measures displacements of mirror 194 at two different spots on the reflecting surface of mirror 194 by two single pass interferometers wherein the measurement beams of the two single beam interferometers are orthogonal to the reflecting surface of mirror 194 independent of changes of orientation of mirror 194. In addition, there are substantially no shears of reference and measurement beams in the two single beam interferometers and the shear of measurement beams of the two single beam interferometers at mirror 194 is the same as the shear of the corresponding measurement beam at mirror 194 of the first embodiment. Displacements measured by the two single beam interferometers are used to monitor linear displacements of mirror 194 and the change in orientation of mirror 194 in one plane.

A first portion of beam 136 that is transmitted by image inverter 192B and beam splitter 192D is reflected by non-polarizing beam splitter 192E as beam 138. Mirror 192A, image inverter 192B, and beam splitter 192E function as a polarization preserving retroreflector for the first portion of beam 136 reflected by beam splitter 192E. A second portion of beam 136 that is transmitted by image inverter 192B and beam splitter 192D is transmitted by non-polarizing beam splitter 192E and then reflected by mirror 192F as beam 138A. Mirror 192A, image inverter 192B and mirror 192F function as a polarization preserving retroreflector for the second portion of beam 136 transmitted by beam splitter 192E. Thus, the description of the properties of beam 138A with respect to shear and direction of propagation are the same as the corresponding portion of the description given for the shear and direction of propagation of beam 138 of the first embodiment.

Beam 138A is incident on a second single beam interferometer generally indicated at 140A in FIG. 3, wherein the first single beam interferometer is interferometer 140. Interferometer 140A comprises elements that have functions the same as functions of elements of interferometer 140. Elements of interferometer 140A corresponding to elements of interferometer 140 have the same element numbers as corresponding elements of interferometer 140 plus a suffix A. Description of the properties of interferometer 140A is the same as the corresponding portion of the description given for interferometer 140 of the first embodiment.

It follows from the properties of input beams 138 and 138A and the properties of interferometers 140 and 140A that the direction of propagation of beams components of beams 142 and 142A are orthogonal to the reflecting surface of mirror 194, i.e., $\theta_M$ and $\theta_{MA}$ are substantially 90 degrees independent of changes in orientation of mirror 194 for a range of orientation angles. It further follows the properties of output beam 144A with respect shear and directions of propagation are the same as the corresponding properties of output beam 144.

Output beam 144A is transmitted by polarizer 172A as a mixed beam that is detected by detector 150A. The description of detector 150A and the processing of the associated heterodyne signal is the same as corresponding portion of the description given for detector 150 and the processing of the associated heterodyne signal of the first embodiment. The measured phase of heterodyne signal generated by detector 150A has the same reduced sensitivity to effects of wavefront errors and beam shears as described for the corresponding phase generated by detector 150 of the first embodiment. The measured phases of the heterodyne signals generated by detectors 150 and 150A are subsequently used to determine changes in displacement and orientation of mirror 194 in one plane.

It will be evident to those skilled in the art that one or more additional single pass interferometers can be added to the second embodiment in the same manner that interferometer 140A was added to the first embodiment to form the second embodiment without departing from the spirit and scope of the present invention. The measured phases of heterodyne signal generated by detectors associated with the additional single pass interferometers have the same reduced sensitivity to effects of wavefront errors and beam shears as described for the corresponding phase generated by detector 150 of the first embodiment.

Figure 4A:
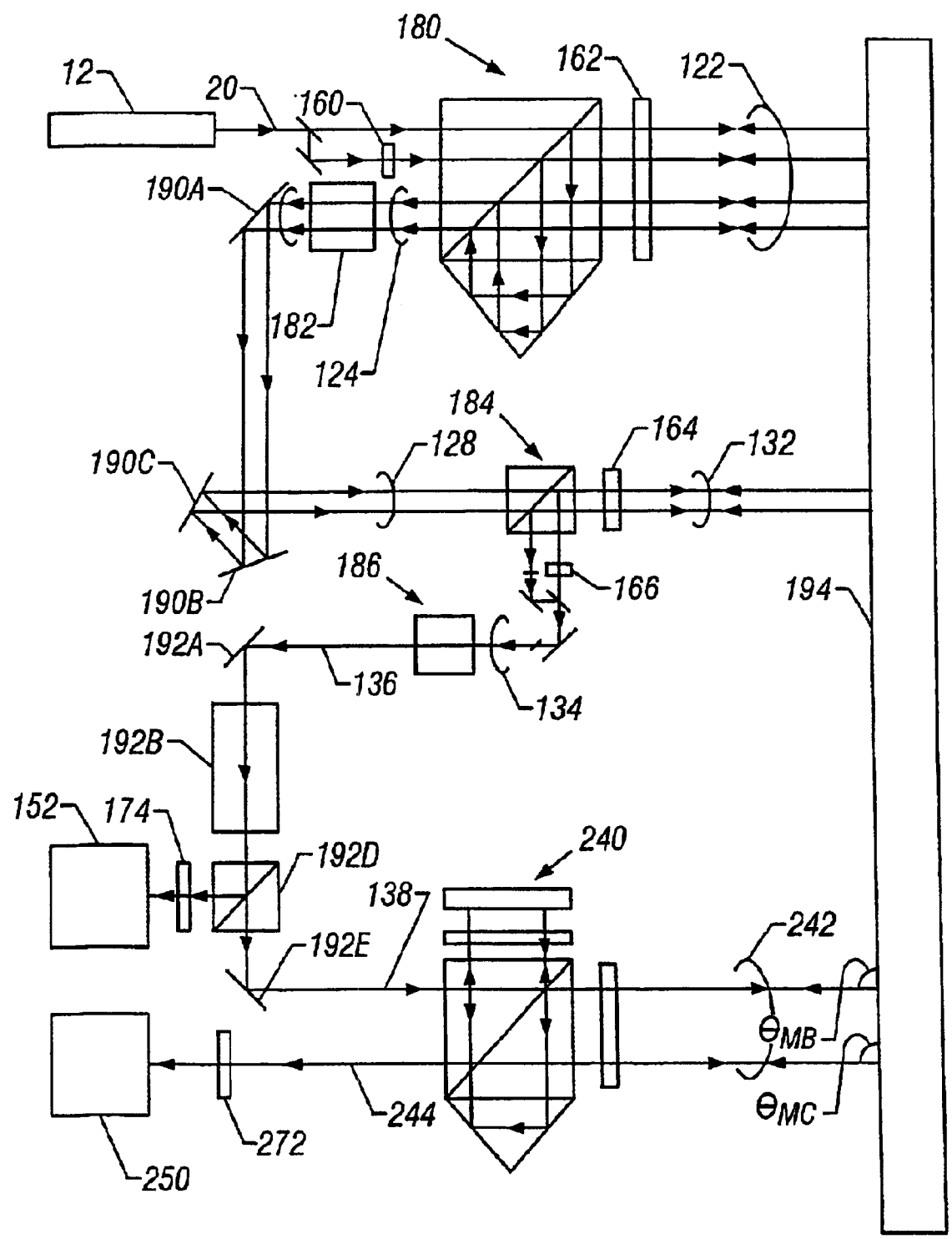
FIG. 4a is a schematic diagram of a third embodiment of the invention.

A third embodiment is shown diagrammatically in FIG. 4a. The third embodiment comprises many elements with functions the same as like numbered elements of the first embodiment. The third embodiment of the present invention measures displacements of mirror 194 at one spot on the reflecting surface of mirror 194 by a double pass interferometer 240 wherein the measurement beams of the double pass interferometer 240 are orthogonal to the reflecting surface of mirror 194 independent of changes of orientation of mirror 194. In addition, there are substantially no shears of reference and measurement beams in double pass interferometer 240 and the shear of measurement beams of the double pass interferometer 240 at mirror 194 is the same as the shear of the corresponding measurement beam at mirror 194 of the first embodiment. Displacements measured by the double pass interferometer are used to monitor linear displacements of mirror 194.

Output beam 244 of interferometer 240 is transmitted by polarizer 272 to form a mixed beam that is detected by detector 250. The measured phase of heterodyne signal generated by detector 250 has the same reduced sensitivity to effects of wavefront errors and beam shears as described for the corresponding phase generated by detector 150 of the first embodiment.

Double pass interferometer 240 of the third embodiment is a high stability plane mirror interferometer. Other double pass interferometers, such as described in "Differential interferometer arrangements for distance and angle measurements: Principles, advantages and applications," by C. Zanoni, may be incorporated into the third embodiment without departing from the spirit and scope of the third embodiment.

It will be evident to those skilled in the art that one or more additional double pass interferometers can be added to the third embodiment in the same manner that single pass interferometer 140A was added to the first embodiment to form the second embodiment without departing from the spirit and scope of the present invention. The measured phases of heterodyne signals generated by detectors associated with the additional double pass interferometers have the same reduced sensitivity to effects of wavefront errors and beam shears as described for the corresponding phase generated by detector 150 of the first embodiment.

Figure 4B:
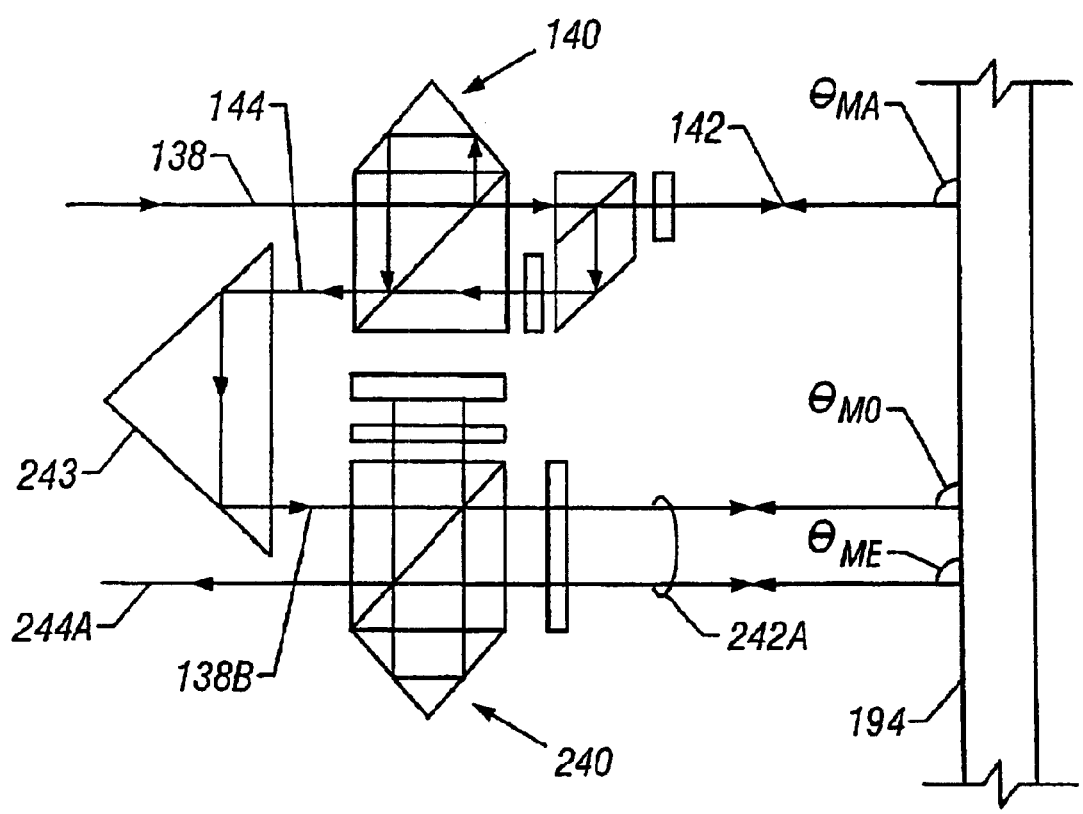
FIG. 4b is a schematic diagram of an additional embodiment of the invention.

Other embodiments of the present invention are described wherein double pass interferometer 240 of the third embodiment is replaced by a triple or higher order pass interferometers. A triple pass interferometer shown diagrammatically in FIG. 4b comprises a single pass interferometer the same as interferometer 140 of the first embodiment and a double pass interferometer such as interferometer 240 of the second embodiment. The output beam 144 of single pass interferometer 140 is transmitted by polarization preserving retroreflector 243 to form beam 138B so that the properties of beam 138B with respect to changes in shear and changes in direction of propagation associated with changes in orientation of mirror 194 are the same as corresponding properties of beam 144 and beam 138. Beam 138B is the input beam for double pass interferometer 240.

Because of the properties of beam 138B with respect to changes in shear and changes in direction of propagation associated with changes in orientation of mirror 194, there are substantially no shears of reference and measurement beams in the triple pass interferometer and the shear of measurement beams of the triple pass interferometer at mirror 194 is the same as the shear of the corresponding measurement beam at mirror 194 of the first embodiment. The angles of incidence $\theta_{MA}$, $\theta_{MD}$, and $\theta_{ME}$ of measurement beams 142 and 242A (see FIG. 4b) are each substantially 90 degrees independent of changes in orientation of mirror 194 for a range of orientation angles. In addition, the measured phase of heterodyne signal generated by a detector detecting output beam 244A of the triple pass interferometer has the same reduced sensitivity to effects of wavefront errors and beam shears as described for the corresponding phase generated by detector 150 of the first embodiment.

Using the principles that are presented to configure a triple pass interferometer for use in an embodiment of the present invention, it will be evident to those skilled in the art as how to configure higher order pass interferometers for use in an embodiment of the present invention that maintain the following properties. There are substantially no shears of reference and measurement beams in the higher order pass interferometer and the shear of measurement beams of the higher order pass interferometer at mirror 194 is the same as the shear of the corresponding measurement beam 142 at mirror 194 of the first embodiment. Directions of propagation of beam components of the measurement beam of the higher order pass interferometer incident on mirror 194 are substantially orthogonal to the reflecting surface of mirror 194 independent of changes of orientation of mirror 194. The measured phase of heterodyne signal generated by a detector detecting the output beam of the higher order pass interferometer has the same reduced sensitivity to effects of wavefront errors and beam shears as described for the corresponding phase generated by detector 150 of the first embodiment.

Figure 5A:
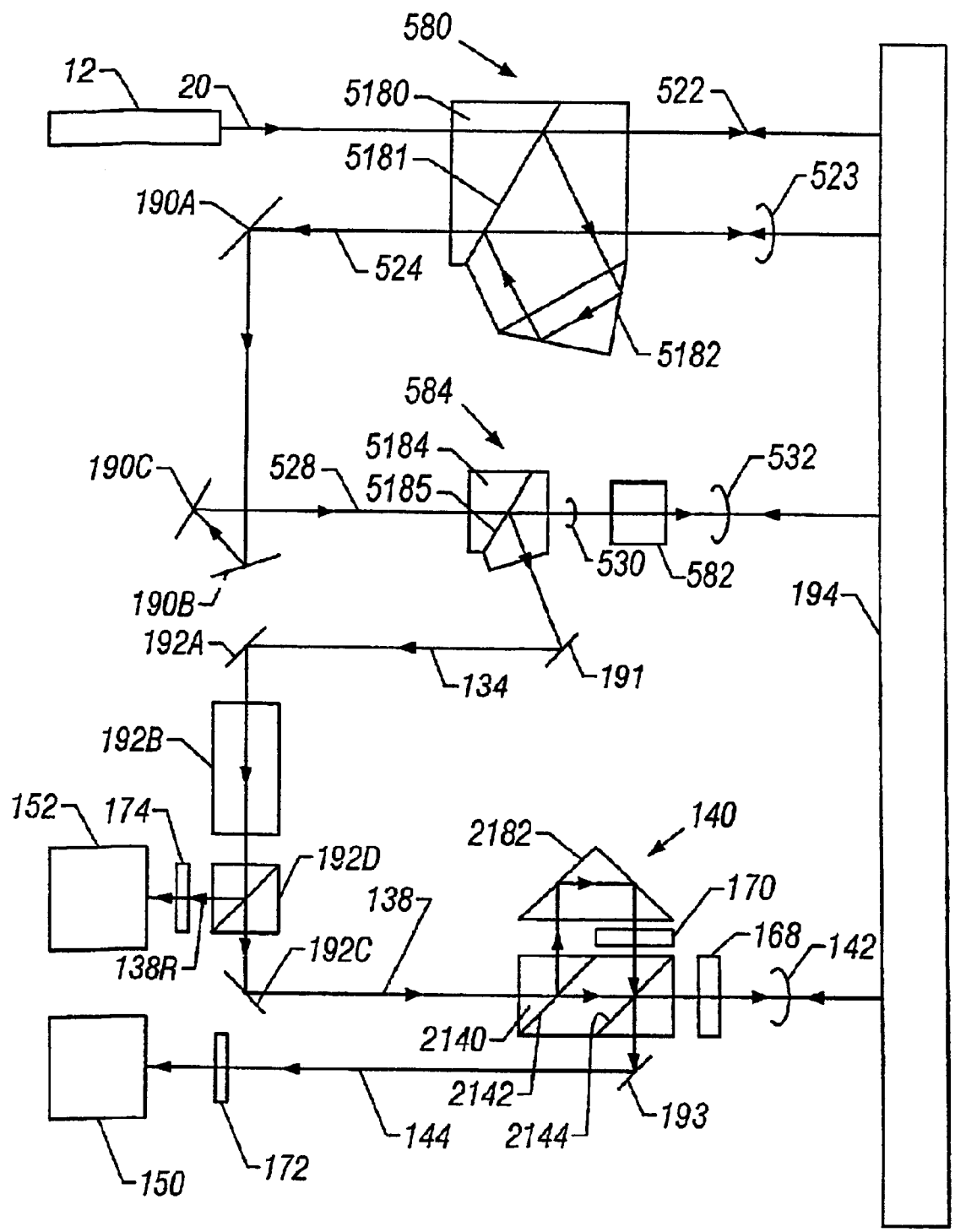
FIGS. 5a–5b are schematic diagrams of a fifth embodiment of the invention.

A fourth embodiment of the present invention is shown diagrammatically in FIG. 5a. The beam conditioner of the fourth embodiment comprises a double pass plane mirror interferometer shown generally at 580 wherein plane mirror 194 serves as both the reference and measuring objects. The beam conditioner further comprises a single pass plane mirror interferometer generally shown at 584 wherein the reference and measurement objects are also plane mirror 194. The remaining components of the beam conditioner is afocal system 582 and beam relay system comprising elements 190A, 190B, and 190C.

The description of source 12 and input beam 20 of the fourth embodiment is the same as the description given for the corresponding elements shown in FIG. 1. Input beam 20 is incident on interferometer 580 to form beams 522 and 523 and output beam 524. Beam 522 comprises coextensive reference and measurement beams that makes a single pass to mirror 194 and beam 523 comprises coextensive reference and measurement beams that makes a single pass to mirror 194. Interferometer 580 comprises an angle sensitive beam-splitter 5180 and retroreflector 5182. Retroreflector 5182 is preferably a polarization preserving retroreflector such as described in U.S. Pat. No. 6,198,574 B1. Propagation direction of beam 524 is parallel to the propagation direction of beam 20.

Beam 524 is incident on beam relay system comprising elements 190A, 190B, and 190C and exits as beam 528. The reflecting properties of the beam relay system are equivalent to those of a single reflecting surface and aligned such that the direction of propagation of beam 528 is parallel to the direction of propagation of beam 524. In addition, the lateral shear of beam 528 resulting from a change in orientation of mirror 194 is the same as the corresponding lateral shear of beam 524.

Beam 528 is incident on single pass interferometer 184 as shown in FIG. 5a and forms beams 530, 532, and conditioned output beam 134. The reflecting surface of mirror 194 serves as the reference and measurement objects for interferometer 584. Beams 530 and 532 each comprise copropagating, i.e., propagating in substantially the same direction, coextensive reference and measurement beams. The diameter of beam 532 is reduced relative to the diameter of beam 530 because of afocal system 582 and beam 532 contacts mirror 194.

The components of beam 530 propagating toward mirror 194 are transmitted by afocal system 582 to form components of beam 532 propagating towards mirror 194 that are demagnified. Propagation directions of components of beam 530 and demagnified beam 532 propagating towards mirror 194 are parallel to the direction of propagation of input beam 20 independent of any change in orientation of mirror 194. This is a direct consequence of the double pass of both the reference and measurement beams to mirror 194 in interferometer 580. However, there are lateral shears of the measurement and reference beam components of beam 530 and demagnified beam 532 propagating towards mirror 194 that result from a change in orientation of mirror 194. The magnitudes of the lateral shear vectors $S_1$ and $S_2$ representing the shears of the measurement and reference beam components of beam 530 and beam 532, respectively, propagating towards mirror 194 are given by Eq. (1). In the present embodiment, L is a physical path length associated with beams 522 and 523.

The magnitude of length L is nominally the distance between the reflecting surface of mirror 194 and a nodal point of retroreflector 5182 measured in a direction parallel to the direction of propagation of input beam 20. A change in angular orientation of mirror 194 comprises the net effect of changes in pitch and yaw. The directions of the lateral shear vectors are in the plane of FIG. 5a for a change in yaw and perpendicular to the plane of FIG. 5a for a change in pitch. The distance between the nodal point of retroreflector 5182 and beam-splitting interface 581 can be beneficially used downstream in a control of subsequent beam shear at a particular system element.

The measurement and reference beam components of beam 532 propagating away from mirror 194 are transmitted by afocal system 582 as a magnified beam, i.e., as components of beam 530 propagating away from mirror 194. Changes in propagation directions $\beta_1$ and $\beta_2$ of components of conditioned output beam 534 and measurement and reference beam components of beam 530 propagating away from mirror 194, respectively, are $$\beta_1 = 2\alpha,$$

$$\beta_2 = 2\alpha/\eta_2, \tag{4}$$

with respect to the direction of propagation of beam 528. Thus for the value of $\eta_2=2$, $\beta_2=\alpha$ with the consequence that the propagation directions of measurement and reference beam components of beam 530 propagation away from mirror 194 are always orthogonal to the reflecting surface of mirror 194 independent of any change in orientation of mirror 194.

Mirror 191 is parallel to beam-splitting interface 584 so that the propagation direction of measurement and reference beam components of conditioned beam 134 are parallel to the propagation directions of the measurement and reference beam components of beam 530 propagating away from mirror 194. Thus for the value of $\eta_2=2$ and accordingly $\beta_2=\alpha$, the propagation directions of measurement and reference beam components of beam 134 are orthogonal to the reflecting surface of mirror 194 independent of any change in orientation of mirror 194 for a range of orientation angles.

The magnitudes of the lateral shear vectors $S_3$ and $S_4$ at afocal system 582 representing the shears of components of beam 532 and beam 530, respectively, propagating away from mirror 194 are $$S_3 = (4\eta_1 L - 2L_2)\alpha,$$

$$S_4 = \eta_2(4\eta_1 L - 2L_2)\alpha \tag{5}$$

where $L_2$ is the distance between afocal system 582 and mirror 194. Because of the factor $(4\eta_1 L - 2L_2)$ in Eq. (5), the magnitudes of lateral shears $S_3$ and $S_4$ are substantially zero for the demagnification factor $$\eta_1 = 0.5 \tag{6}$$

for $L_2 \cong L$. Thus for $\eta_1=0.5$, there are substantially no lateral shears of the components of beam 530 propagating away from mirror 194 and of conditioned output beam 134 that result from a change in orientation of mirror 194 for at least a range of orientation angles. The ratio $L/L_2$ in the factor $(4\eta_1 L - 2L_2)$ may be beneficially selected in a control of subsequent beam shear at a particular downstream system element.

The important position and propagation direction properties of measurement and reference beam components of conditioned beam 134 are that there are substantially no lateral shears of the components associated with changes in orientation of mirror 194 and that the angular changes in propagation direction of components are the same as the angular changes in orientation of mirror 194. Another important property is that corresponding measurement and reference beam components of beams in interferometers 180 and 184 including measurement and reference beam paths to measurement and reference object 194 are coextensive.

Next, as shown in FIG. 5a, conditioned output beam 134 is incident on a second relay optical system comprising mirrors 192A and 192C and image inverter 192B. Non-polarizing beam splitter 192D does not alter the properties of the second relay optical system with respect to the relative directions of propagation of beams 134 and 138. The properties of the second relay optical system are the same as a polarization preserving retroreflector with regard to properties of the transmitted beam 138 relative to properties of incident beam 134. A polarization preserving retroreflector such as described in cited U.S. Pat. No. 6,198,574 B1 is a preferred form of retroreflector in order to eliminate a potential source of polarization mixing. Polarization mixing generally will generate cyclic errors in changes in displacement of mirror 194 as measured subsequently by the first embodiment.

Figure 5B:
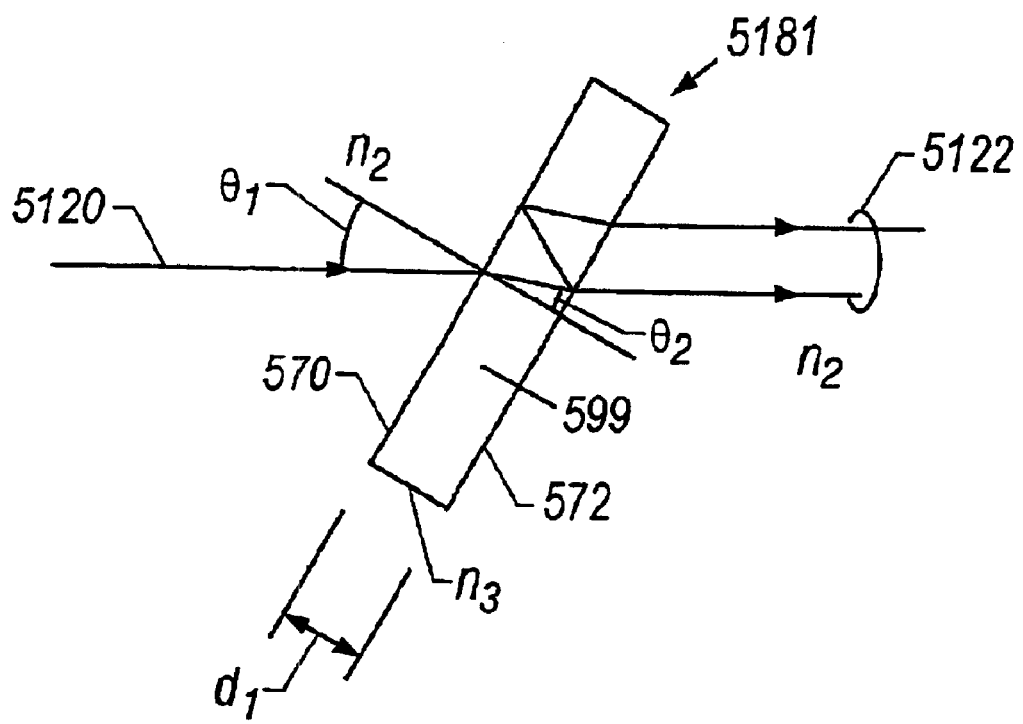

Angle sensitive beam-splitter interfaces 581 and 585 comprise a Fabry-Perot cavity, such as generally shown as Fabry-Perot cavity 5181 in FIG. 5b. The Fabry-Perot cavity comprises a spacer 599 of index of refraction $n_3$ and thickness $d_1$ in between substrates having indices of refraction $n_2$. The Fabry-Perot cavity is coated with a high reflective coating at surfaces 570 and 572. The high reflective coating preferably comprises multi-layer dialectic thin film stacks such as alternating layers of ZnS and $Na_3AlF_6$. For substrates and cavity comprising fused silica and an angle of incidence of $\theta_1=30$ degrees, the reflectivity of the highly reflective coatings can be high for both the s and p components of input beam 5120, e.g., greater $\geq 98.9\%$ for both the s and p components for a 19 layer stack of ZnS and $Na_3AlF_6$. In addition, the difference in phase shifts of the reflected s and p components is small, e.g., 14 degrees.

The Fabry-Perot cavity will transmit input beam 5120 with high efficiency for a sequence of input values of angle $\theta_1$ according to well known properties of Fabry-Perot cavities. The difference $\Delta\theta_1$ in $\theta_1$ for contiguous transmitting peaks of the Fabry-Perot cavity can be expressed for the case of $n_3=n_2$ as $$\Delta\theta_1 = \frac{\lambda_1}{2n_2\sin\theta_1}\frac{1}{d_1} \quad (7)$$

where $\lambda_1$ is the wavelength of beam 5120 and $d_1$ is the thickness of the cavity. The value of $\Delta\theta_1$ is preferably small with a typical values being of the order of 0.001 to 0.008 radians. The angles for the transmission peaks for the s and p components of beam 5120 can be made to coincide by compensating for the difference in phase shifts experienced by the s and p components upon reflection by the highly reflective coatings 570 and 572. The compensation may be achieved by the introduction of a thin birefringent layer in the cavity of 5181. The compensation may also be achieved by the introduction of an appropriate small angle between the s and p components of the beams in, e.g., beam-splitter 580 using birefringent prisms before and after beam-splitter 580.

The alignment of the beam-splitting interface 5181 is selected to transmit input beam 5120 with high efficiency and the alignment of mirror 194 is aligned relative to interface 5181 so that the measurement and reference beam components of beam 5122 are reflected by beam-splitter interface 5181. The typical angle between the measurement and reference beam components of beam 5122 propagation directions propagating toward mirror 194 and propagating away from mirror 194 is approximately $\Delta\theta_1/2$ and of the order of 0.0005 to 0.004 radians. The value of $\Delta\theta_1$ selected for an end use application will depend upon the range over which the orientation of mirror 194 is expected to change.

Interferometers 580 and 584 are shown diagrammatically in FIG. 5a with the beams 522, 523, and 532 lying in the same plane so as to simplify the description of the operation of the present invention. The configuration of the first embodiment as shown in FIG. 5a also has an advantage with respect to the minimum width required for the reflecting surface of mirror 194 in the dimension perpendicular to the plane of FIG. 5a. It will be evident to those skilled in the art that other configurations of interferometers 580 and 584 may be used wherein beams 522, 523, and 532 comprise two or more planes parallel to the plane of FIG. 5a without departing from the spirit and scope of the present invention.

It will be apparent to one skilled in the art that while the above-described beam conditioners comprise components for compensating both beam propagation angle variations and beam shear of the conditioned beam at the input to the interferometer, other implementations are possible. For example, the beam conditioner could compensate for variations in the beam propagation angle without compensating for beam shear at the interferometer input. For instance, directing the input beam directly into the single pass interferometer of the beam conditioner in the above-described embodiments, instead of first directing the beam to the double pass interferometer of the beam conditioner, would result in a beam that is orthogonal to plane mirror 194, but may have non-zero shear at the input to the interferometer.

Figure 6:
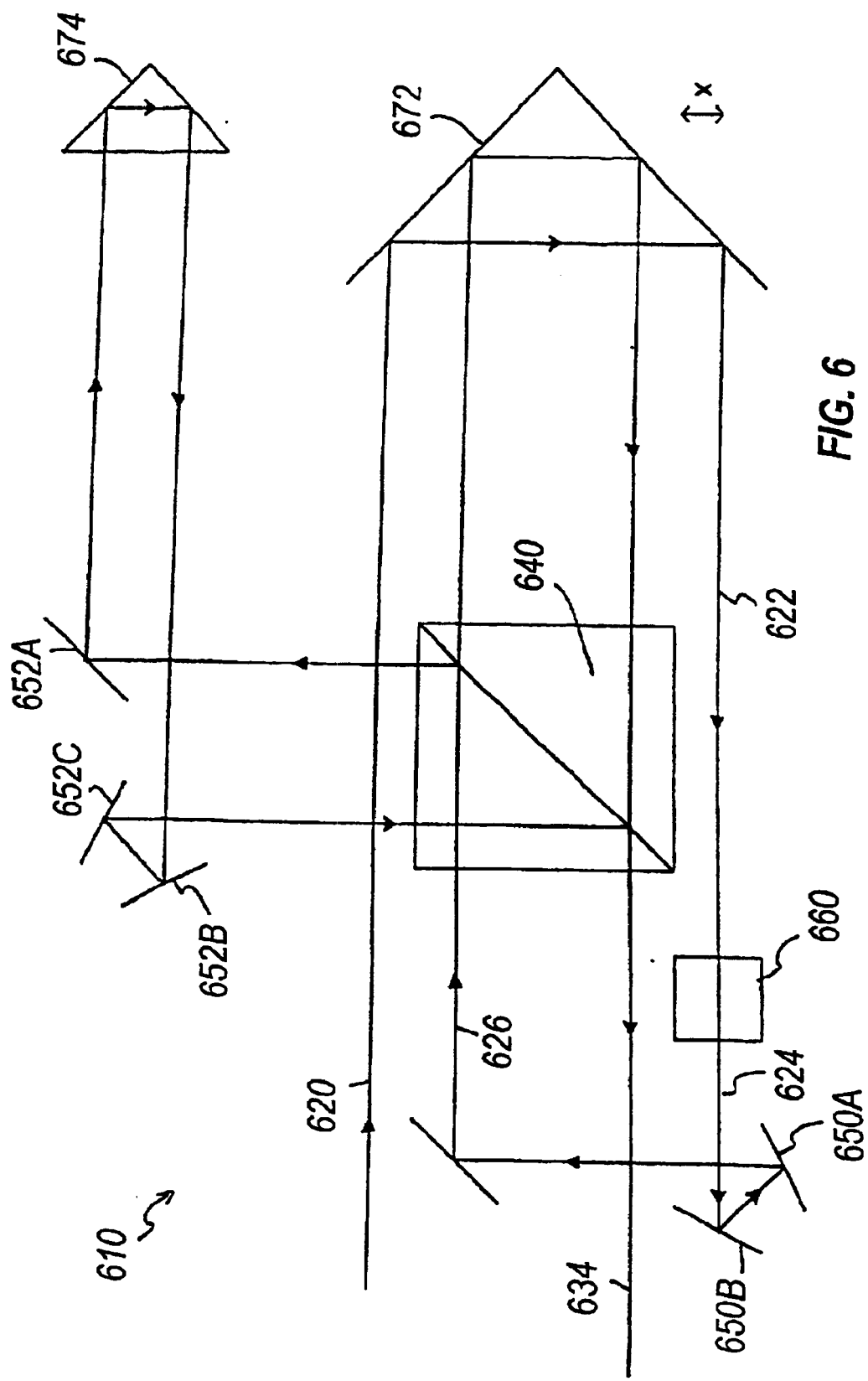
FIG. 6 is a schematic diagram of a sixth embodiment of the invention.

A fifth embodiment of the present invention is shown diagrammatically at 610 in FIG. 6. The fifth embodiment comprises a single-pass non-plane mirror interferometer and a beam conditioning system. The beam conditioning system introduces a lateral beam shear into a conditioned input beam such that there is no lateral shear of the output beam of the interferometer independent of a lateral displacement of a retroreflector measurement object.

Interferometer 610 is shown in FIG. 6 as a Michelson interferometer in a simple illustration. Other forms of interferometers, such as described in the cited article entitled "Differential interferometer arrangements for distance and angle measurements: Principles, advantages and applications" by C. Zanoni, may be incorporated without departing from the scope and spirit of the present invention. For example, the interferometer may be configured to measure multiple axes of metrology.

The non-plane mirror measurement object comprises retroreflector 672. Input beam 620 is reflected by retroreflector 672 and then transmitted by afocal lens system 660 as conditioned input beam 624. A lateral translation x of a retroreflector 672 induces a beam shear of 2x in beam 622 reflected by the retroreflector 672. The propagation direction of beam 622 is parallel to propagation direction of beam 620. Afocal lens system 660 demagnifies beam 622. For a magnification factor of 0.5, the diameter of conditioned beam 624 is one half of the diameter of beam 622. Accordingly, the demagnification by afocal lens system 660 further reduces the lateral shear of beam 624 to x. However, the propagation direction of conditioned input beam 624 is parallel to the propagation direction of input beam 620. Afocal lens system 660 may comprise afocal attachments, such as the afocal attachments described in reference to the foregoing embodiments, without departing from the scope and spirit of the present invention.

Next, conditioned input beam 624 is sent through an optical system to form conditioned input beam 626. The optical system is configured so that the shear of conditioned input beam 626 is the same in both magnitude and direction as the shear of conditioned input beam 624. The optical system is further configured so that the propagation of conditioned input beam 626 is substantially the same as the propagation direction of conditioned input beam 624. The optical system shown in FIG. 6 comprises three plane mirrors 650A, 650B, and 650C with normals of the respective reflecting surfaces parallel to a common plane, i.e., the plane of FIG. 6.

As shown in FIG. 6, the measurement beam component of conditioned input beam 626 is transmitted twice by polarizing beam splitter 640 and reflected by retroreflector 672 to form a measurement beam component of output beam 634. The lateral shear of the measurement beam component of output beam 634 is x and the propagation direction of the measurement beam component of output beam 634 is substantially parallel to propagation direction of input beam 620.

The reference beam component of conditioned input beam 626 is reflected twice by polarizing beam splitter 640 and reflected by retroreflector 674 and elements of a reference optical system to form a reference beam component of output beam 634. The reference optical system is configured so that the shear in the reference beam component of output beam 634 is the same in both magnitude and direction as the shear of measurement beam component of beam 634 that is produced by a lateral displacement of retroreflector 672. The reference optical system is further configured so that the propagation direction of the reference beam component of output beam 634 is substantially the same as the propagation direction of the measurement beam component of output beam 634. The reference optical system shown in FIG. 6 comprises three plane mirrors 652A, 652B, and 652C with normals of the respective reflecting surfaces parallel to a common plane, i.e., the plane of FIG. 6.

An advantage of the fifth embodiment of the present invention is that there is no relative lateral shear of measurement and reference beam components of output beam 634 produced by a lateral displacement of retroreflector 672.

Another advantage of the fifth embodiment of the present invention is that there is no change in relative propagation directions of measurement and reference beam components of output beam 634 produced by a lateral displacement of retroreflector 672

Another advantage of the fifth embodiment of the present invention is that there is no relative lateral shear of the measurement and reference beam components of output beam 634 at a subsequent detector (not shown) produced by a lateral displacement of retroreflector 672. This advantage is particularly important when using a fiber optic for transport of the output beam to a remote detector.

Another advantage of the fifth embodiment of the present invention is that there is no change in relative propagation directions of the measurement and reference beam components of output beam 634 at a subsequent detector produced by a lateral displacement of retroreflector 672.

Both of the advantages relate to reduction of non-linear non-cyclic errors in detected heterodyne signals.

Figure 7:
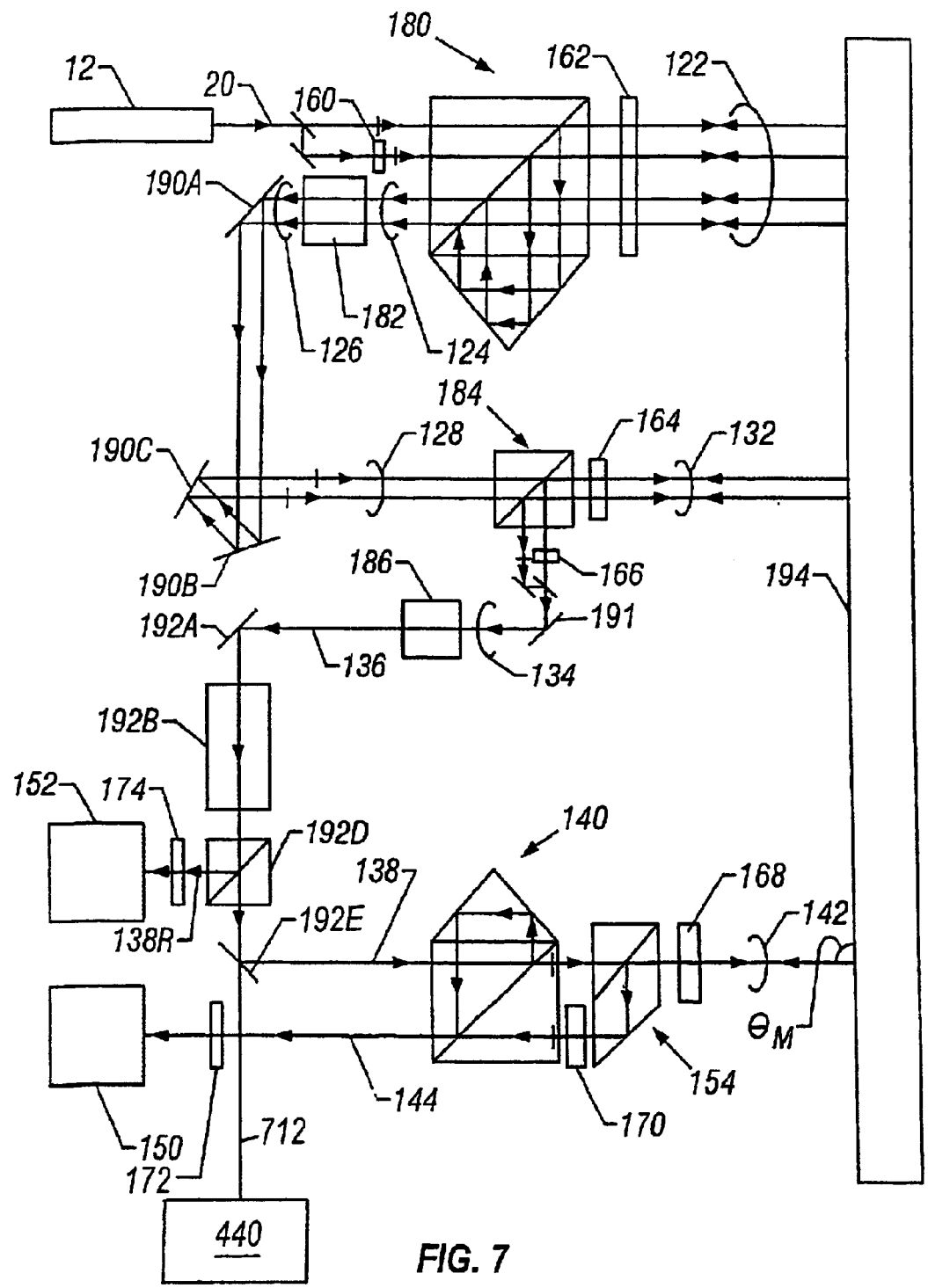
FIG. 7 is a schematic diagram of a variation of the first embodiment of the invention.

A sixth embodiment of the present invention is shown diagrammatically in FIG. 7. The sixth embodiment comprises many elements with functions the same as like numbered elements of the first embodiment. The sixth embodiment of the present invention measures a displacement of mirror 194 at one spot on the reflecting surface of mirror 194 and measures the change in orientation of mirror 194 in a plane by measuring a corresponding change in a direction of propagation of a beam that is orthogonal to the surface of mirror 194 independent of changes in orientation of mirror 194, for at least a range of orientation angles. The measurement beam 142 of the single pass interferometer 140 is orthogonal to the reflecting surface of mirror 194 independent of changes of orientation of mirror 194. In addition, there are substantially no shears of reference and measurement beams in single pass interferometer 140 and angle interferometer 440 and the shear of the measurement beam of the single pass interferometer 140 at mirror 194 is the same as the shear of the corresponding measurement beam at mirror 194 of the first embodiment. The displacements measured by the single pass interferometer and the angle interferometer are used to monitor linear displacements of mirror 194 and a change in angular orientation of mirror 194 in one plane.

The angle interferometer of the sixth embodiment is generally shown at 440 in FIG. 7. A beam splitter 192E directs beam 138 toward interferometer 140 and transmits beam 712 to angle interferometer 440. The polarization of beam 712 is the same as the polarization of beam 138. In alternative embodiments, beam 712 can be derived from output beam 144 or from measurement beam 142.

Figure 8A:
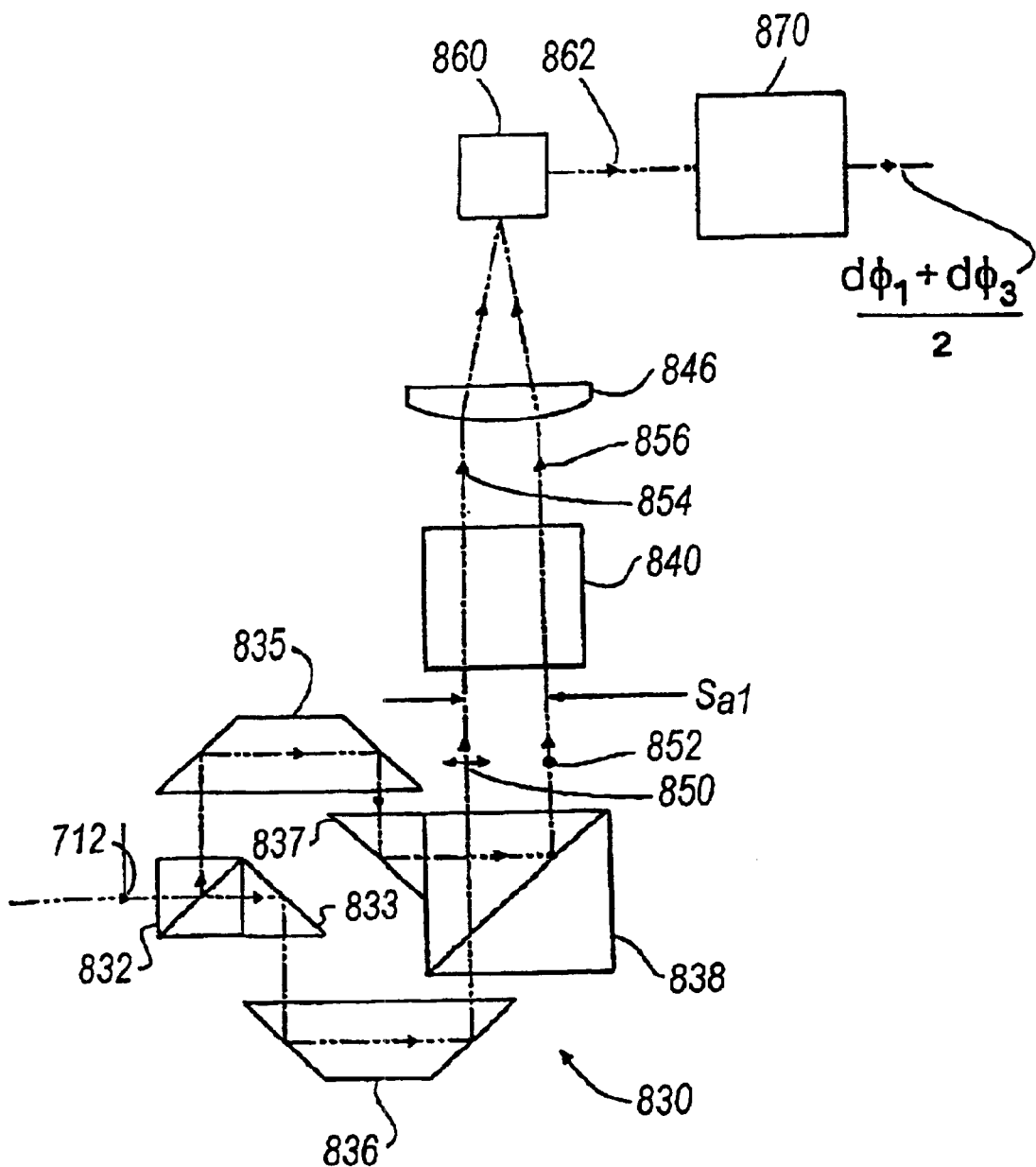

A first embodiment of an angle interferometer is shown schematically in FIG. 8a and makes angle measurements in one plane of the average direction of propagation of beam 712 relative to a predefined optical axis. The first embodiment comprises beam-shearing assembly generally shown at element numeral 830, analyzer 840, lens 846, detector 860, and electronic processor 870. For heterodyne interferometry, input beam 712 comprises two orthogonally polarized optical beam components having a difference in frequencies of $f_1$. The planes of polarization of the two orthogonally polarized components are parallel and orthogonal to the plane of FIG. 8a, respectively.

Beam-shearing assembly 830 introduces a lateral shear $S_{\alpha 1}$ between the two orthogonally polarized beams 850 and 852, respectively (see FIG. 8a). A portion of each of the spatially sheared output beams 850 and 852 are transmitted by analyzer 840 as components 854 and 856, respectively. Analyzer 840 is orientated so that beam components 854 and 856 are both polarized in a common plane orientated at 45 degrees to the plane of FIG. 8a.

Next, beam components 854 and 856 are incident on lens 846 wherein lens 846 focuses beam components 854 and 856 to spots on detector 860 to be detected preferably by a quantum photon detector to generate electrical interference signal 862 or heterodyne signal $s_1$. The spots substantially overlap. Heterodyne signal $s_1$ is transmitted to electronic processor 870 for determination of the heterodyne phase of signal $s_1$ and a corresponding average direction of propagation of beam 712 in the plane of FIG. 8a.

Beam-shearing assembly 830 comprises polarizing beam-splitters 832 and 838, right angle prisms 833 and 837, and truncated Porro prisms 835 and 836. The component of beam 712 polarized in the plane of FIG. 8a is transmitted by polarizing beam-splitter 832, reflected by right angle prism 833, redirected by truncated Porro prism 836, and reflected by polarizing beam-splitter 838 as beam 850. The component of beam 712 polarized orthogonal to the plane of FIG. 8a is reflected by polarizing beam-splitter 832, redirected by truncated Porro prism 835, reflected by right angle prism 837, and transmitted by polarizing beam-splitter 838 as beam 852.

Note that the optical path in glass for each of beams 854 and 856 through beam-shearing assembly 830 and analyzer 840 are preferably the same. This feature of the apparatus design of the first embodiment produces a high stability interferometer system with respect to changes in temperature.

Heterodyne signal $s_1$ may be written as $$s_1 = A_1 \cos(\omega_1 t + \phi_1 + \zeta_1) \quad (8)$$

where $$\phi_1 = 2k_1 n [d_1 \cos\theta'_1 + d_2 \cos\theta'_2 - d_3 \cos\theta'_3 - d_4 \cos\theta'_4], \quad (9)$$

Figure 8B:
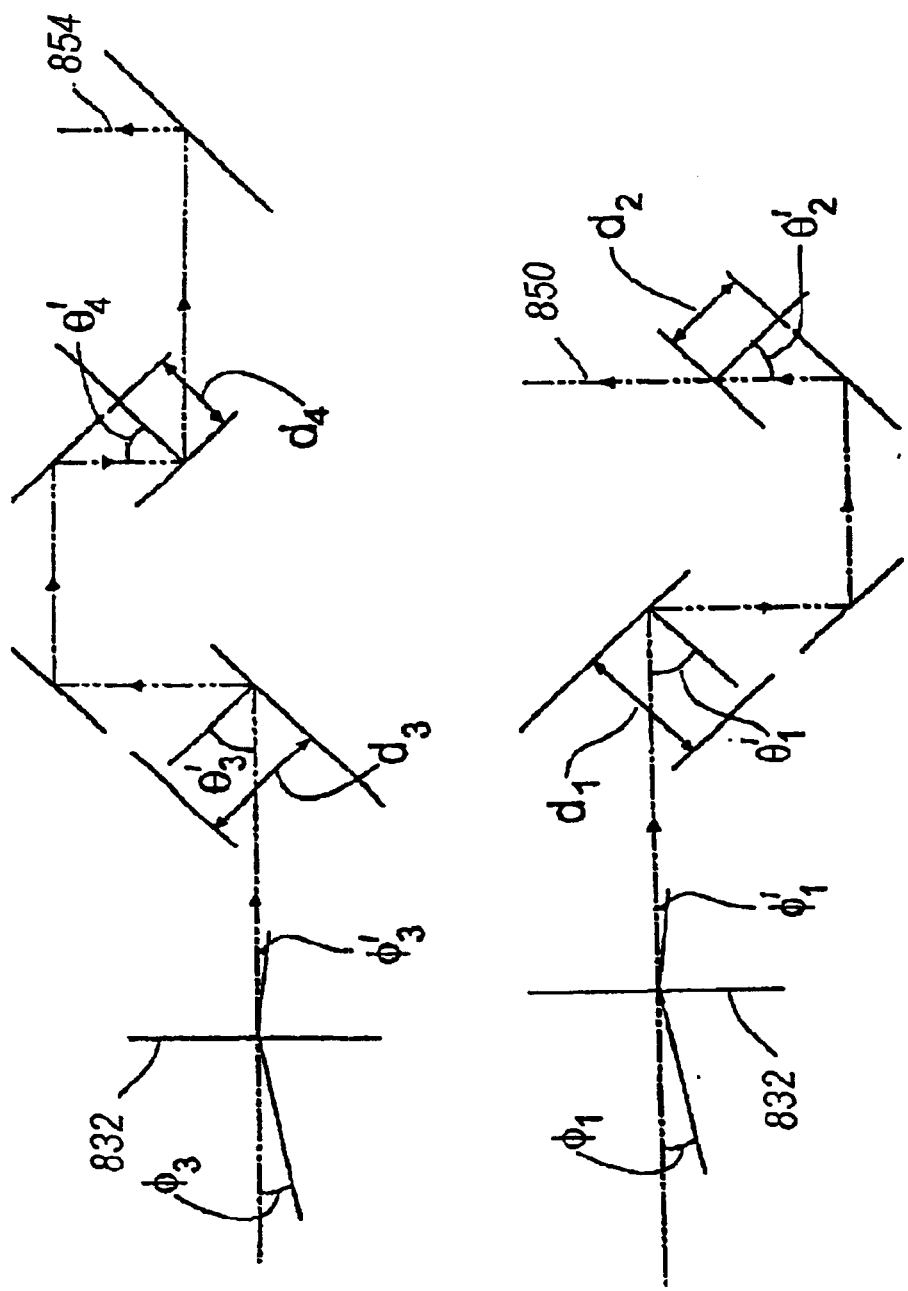

$\omega_1 = 2\pi f_1$, $\zeta_1$ is an offset phase not associated with phase $\phi_1$, $k_1 = 2\pi/\lambda_1$, $\lambda_1$ is the wave length of input beam 712, $\theta'_1$ and $\theta'_2$ are angles of incidence of beam 850 at right angle prism 833 and at the polarizing beam-splitter 838, respectively, (see FIG. 8b), $\theta'_3$ and $\theta'_4$ are angles of incidence of beam 852 at polarizing beam-splitter 832 and at right angle prism 837, respectively, and $d_1$, $d_2$, $d_3$, and $d_4$ are defined in FIG. 8b. It has been assumed in Eq. (9) for the purposes of demonstrating the features of the present invention in a simple fashion without departing from the scope and spirit of the present invention that all of the optical paths in beam-shearing assembly 30 have the same index of refraction. For a non-limiting example of $d_1=d_3$, $d_2=d_4$, $\theta'_1+\theta'_2=\pi/2$, and $\theta'_3+\theta'_4=\pi/2$, Eq. (9) reduces to the simpler expression for $\phi_1$, $$\varphi_1 = 2^{1/2}k_1 n \begin{bmatrix} (d_1-d_2)[\cos(\theta'_1+\pi/4)+\cos(\theta'_4+\pi/4)] + \\ (d_1+d_2)[\sin(\theta'_1+\pi/4)-\sin(\theta'_4+\pi/4)] \end{bmatrix}. \quad (10)$$

Lateral shear $S_{\alpha 1}$ is related to properties of beam-shearing assembly 830 according to the equation $$S_{\alpha I} = 2\begin{bmatrix} (d_1\sin\theta'_1 - d_2\sin\theta'_2)\sec\phi'_1\cos\phi_1 + \\ (d_3\sin\theta'_3 - d_4\sin\theta'_4)\sec\phi'_3\cos\phi_3 \end{bmatrix} \quad (11)$$

where $\phi_1$ and $\phi'_1$ are the angles of incidence and refraction of beam 850 at entrance facet of polarizing beam-splitter 832 and $\phi_3$ and $\phi'_3$ are the angles of incidence and refraction of beam 852 at entrance facet of polarizing beam-splitter 832 (see FIG. 8b). For the non-limiting example, $$S_{\alpha I} = 2^{1/2}\left\{(d_1-d_2)\begin{bmatrix}\sin(\theta'_1+\pi/2)\sec\phi'_1\cos\phi_1 + \\ \sin(\theta'_4+\pi/2)\sec\phi'_3\cos\phi_3\end{bmatrix} + (d_1+d_2)\begin{bmatrix}\sin(\theta'_1-\pi/2)\sec\phi'_1\cos\phi_1 - \\ \sin(\theta'_4-\pi/2)\sec\phi'_3\cos\phi_3\end{bmatrix}\right\}. \quad (12)$$

The expression given for $S_{\alpha 1}$ by Eqs. (11) and (12) represent the primary mechanism used for generation of the beam shear. However, there are other mechanisms for introducing a beam shear such as associated with angle of incidence dependent phase shifts (e.g., Goos-Hänchen effect).

Figure 8C:
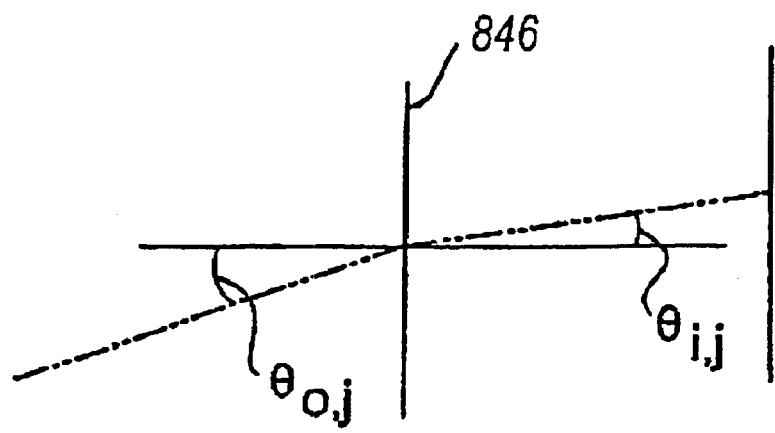
Figure 8D:
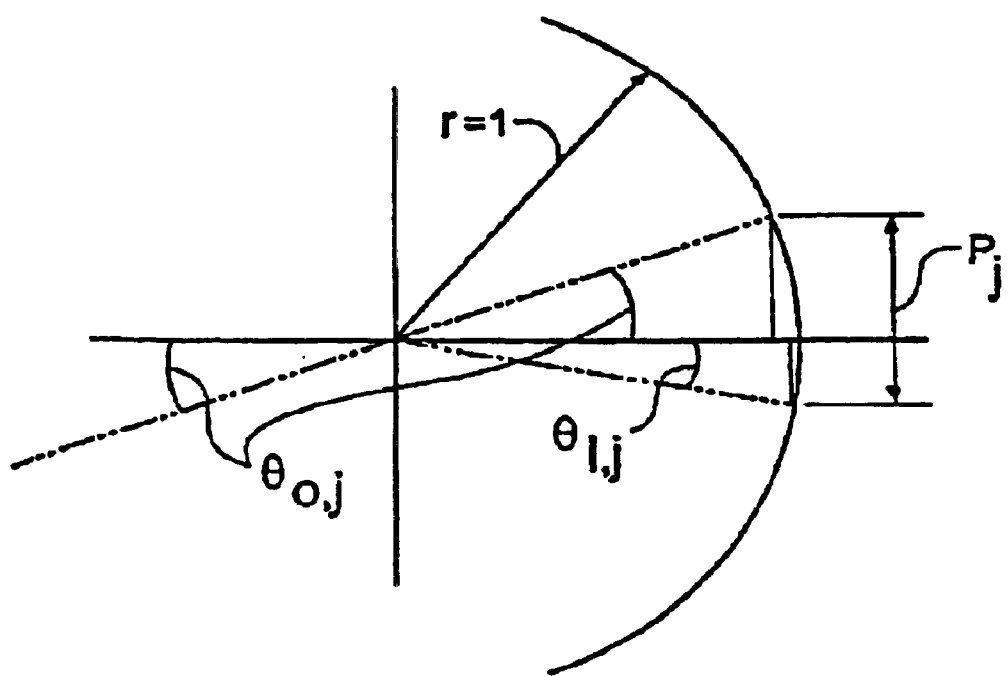

Amplitude $A_1$ is proportional to a good approximation to a Fourier component of the Fourier transform of $|h(p_1)|^2$, i.e., $$A_1 \propto \int |h(p_1)|^2 \cos[4k_1 p_1 S_1] dp_1 \quad (13)$$

where $h(p_1)$ is the Fourier transform of the amplitude of one of the beams 854 or 856 at lens 846 multiplied by the pupil function of lens 846, $$p_j = \sin\theta_{o,j} + \sin\theta_{i,j}, j=1,2\ldots, \quad (14)$$

and the definition of $\theta_{o,j}$ and $\theta_{i,j}$ are shown in FIG. 8c. Angles $\theta_{o,j}$ and $\theta_{i,j}$ are conjugate angles of principle rays of beam j in the object and image space of lens 846. The definition of $p_j$ is shown in FIG. 8d.

It is evident from Eqs. (9) and (10) that the resolution of phase $\phi_1$ in terms of a change in a direction of an optical beam is increased as the length $2^{3/2}(d_1-d_2)$ is increased. However, the usable range for $2^{3/2}(d_1-d_2)$ is defined by the spatial frequency bandwidth of the Fourier transform of $|h(p_1)|^2$ as shown by Eq. (13).

The optimum value for $2^{3/2}(d_1-d_2)$ is generally equal to approximately one half a characteristic spatial dimension of a beam transmitted by a respective pupil. Consider, for example, the case of a rectangular pupil of dimension b in the plane of FIG. 8a for both beam 854 and beam 856 at lens 846 and the amplitudes of beams 854 and 856 being uniform across respective pupils. For this case, $|h(p_1)|^2$ is a sinc function squared, i.e., $(\sin x/x)^2$, and the Fourier transform of $|h(p_1)|^2$ is a triangle function, $\Lambda$. Triangle function, $\Lambda$, has a maximum value of 1 for $2^{3/2}(d_1-d_2)=0$ and has a value of 0 for $2^{3/2}(d_1-d_2)\geq b$. Therefore, amplitude $A_1=0$ for $2^{3/2}(d_1-d_2)\geq b$ and the resolution of phase $\phi_1$ in terms of a change in a direction of an optical beam is 0 for $2^{3/2}(d_1-d_2)=0$. Thus the optimum value for $2^{3/2}(d_1-d_2)$ is in this case approximately $b/2$. The actual optimum value for $2^{3/2}(d_1-d_2)$ will depend on the criterion used to define an optimum operating condition with respect to a signal-to-noise ratio, for example. For the case where the components of beam 712 have Gaussian intensity profiles, the optimum value for $2^{3/2}(d_1-d_2)$ will be approximately w where w is the radius at which the intensity of beam 712 has a value equal to $1/e$ of the intensity at beam 712 at its center.

For an example of a beam having a Gaussian intensity profile with $2w=5.0$ mm, $\theta_1=45$ degrees, and $\lambda_1=633$ nm, the sensitivity of the phase $\phi_1$ to changes in $d\phi_1$ and $d\phi_3$ expressed in differential form is given by the equation $$d\varphi_1 = k_1 w\left[\frac{d\phi_1+d\phi_3}{2}\right] \quad (15)$$
$$= -2.5\times 10^4\left[\frac{d\phi_1+d\phi_3}{2}\right].$$

Note, as evident from Eq. (15), that the sensitivity of the change in phase $\phi_1$ with respect to changes in angles $d\phi_1$ and $d\phi_3$ is independent of the index of refraction n. This is an important property of the first embodiment of the angle interferometer. In particular, the sensitivity of the change in phase $\phi_1$ with respect to changes in angles $d\phi_1$ and $d\phi_3$ has a sensitivity to temperature changes that is independent in first order to thermal induced changes in the refractive index of the optical elements of beam-shearing assembly 830 and only dependent on thermal coefficients of expansion of the optical elements of beam-shearing assembly 830. The thermal coefficients of the elements of beam-shearing assembly 830 can be selected to be less than $\leq 0.5$ ppm/° C. For similar reasons, the zero value of $\phi_1$ also exhibits a corresponding low sensitivity to changes in temperature of beam-shearing assembly 830.

The two primary quantities that place restrictions on the range of average value $[d\phi_1+d\phi_3]/2$ that can be accommodated by the first embodiment are the magnitude of the difference $[d\phi_1-d\phi_3]/2$ and the size of the sensitive area of detector 860. The amplitude of the heterodyne signal will be reduced by a factor of approximately 2 when $$wk_1\left[\frac{[d\phi_1-d\phi_3]}{2}\right] \approx 1.$$

The higher terms in $d\phi_1$ and $d\phi_3$ that are omitted in Eq. (15) can be easily determined from Eq. (9) if required for a particular end use application.

Figure 8E:
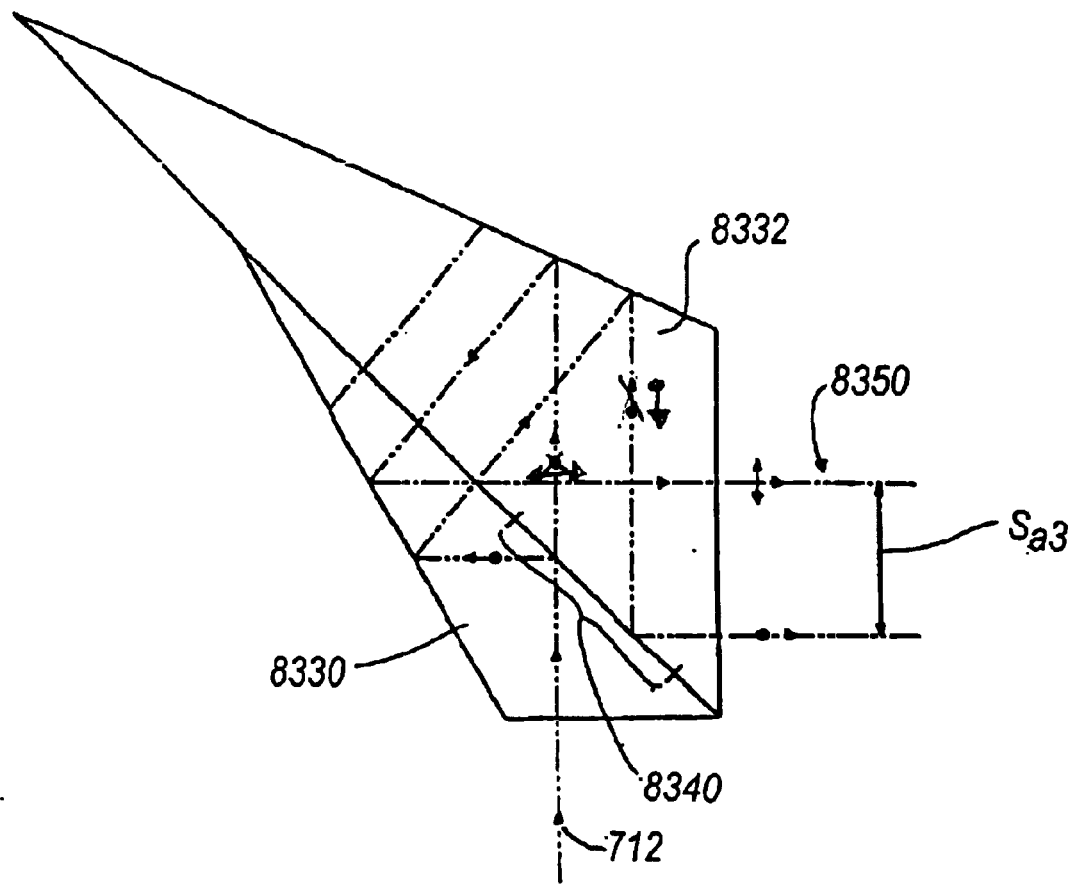

A second embodiment of beam-shearing assembly 830 is shown diagrammatically in FIG. 8e and comprises two prisms 8330 and 8332 and polarization beam-splitter interface 8340. A first component of input beam 712 is transmitted twice by polarization beam-splitter interface 8340 and reflected by facets of prisms 8330 and 8332 to form output beam 8350. A second component of input beam 712 is reflected twice by polarization beam-splitter interface 8340 and reflected by facets of prisms 8330 and 8332 to form output beam 8352.

The two prisms 8330 and 8332 and polarization beam-splitter interface 8340 exhibit properties the same as a Penta prism with respect to relationship of the direction of propagation of beam 712 and the directions of propagation for beams 8350 and 8352. Prisms 8330 and 8332 are preferably isomorphic with relative sizes selected to introduce a beam shear $S_{\alpha 3}$ between beams 8350 and 8352. The optical paths in refractive media are substantially the same for beam 8350 and 8352. The remaining descriptions of beams 8350 and 8352 are the same as the corresponding portion of the descriptions given for beams 850 and 852 of the first embodiment with shear $S_{\alpha 1}$ replaced by shear $S_{\alpha 3}$. The description of input beam 712 in FIG. 8e is the same as the description of input beam 712 of the first embodiment shown in FIG. 8a.

A first variant of the first embodiment of the angle interferometer is described wherein beam 712 comprises a single frequency, for example, in homodyne interferometry and/or when beam 712 is derived from measurement beam 142 (see FIG. 7). The first variant of the first embodiment comprises the apparatus and beams of the first embodiment shown in FIG. 8f with the same element number as elements of the first embodiment performing like functions and additional components. The additional components are incorporated to permit homodyne detection of a phase.

The beam-shearing assembly 830H of the first variant of the first embodiment of the angle interferometer is the same as beam-shearing assembly 830 of the first embodiment. Beam-splitter 838H in the first variant of the first embodiment is a non-polarizing beam-splitter and generates beams 854B and 856B in addition to beams 854A and 856A. Description of beams 854A and 856A is the same as the description of beams 854 and 856 of the first embodiment except with respect to amplitudes. A relative phase shift is introduced between beams 854B and 856B by adjusting respective path lengths following beam-splitter 838H by phase retardation plate 831H. Beams 854B and 856B have the same state of polarization as a consequence of analyzer 840H and are focused by lens 846H to respective spots in a detector plane at detector 860H as shown schematically in FIG. 8f. Focused beams 854B and 856B are detected by detector 860H to produce electrical interference signal 862B. The path length difference between 854B and 856B and the retardance and orientation of phase retardation plate 831H are selected to introduce a 90 degree phase shift between interference signals 862A and 862B. Hence, electrical interference signals 862A and 862B comprise quadrature signals that are processed by electronic processor 870H for angle $[d\phi_1 + d\phi_3]/2$. The description of lens 846H, detector 860H, and electric processor 870H is the same as corresponding portions of the description given for lens 846, detector 860, and electronic processor 870 of the first embodiment.

The remaining description of the first variant of the first embodiment of the angle interferometer is the same as the corresponding portion of the description given for the first embodiment of the angle interferometer.

Figure 9A:
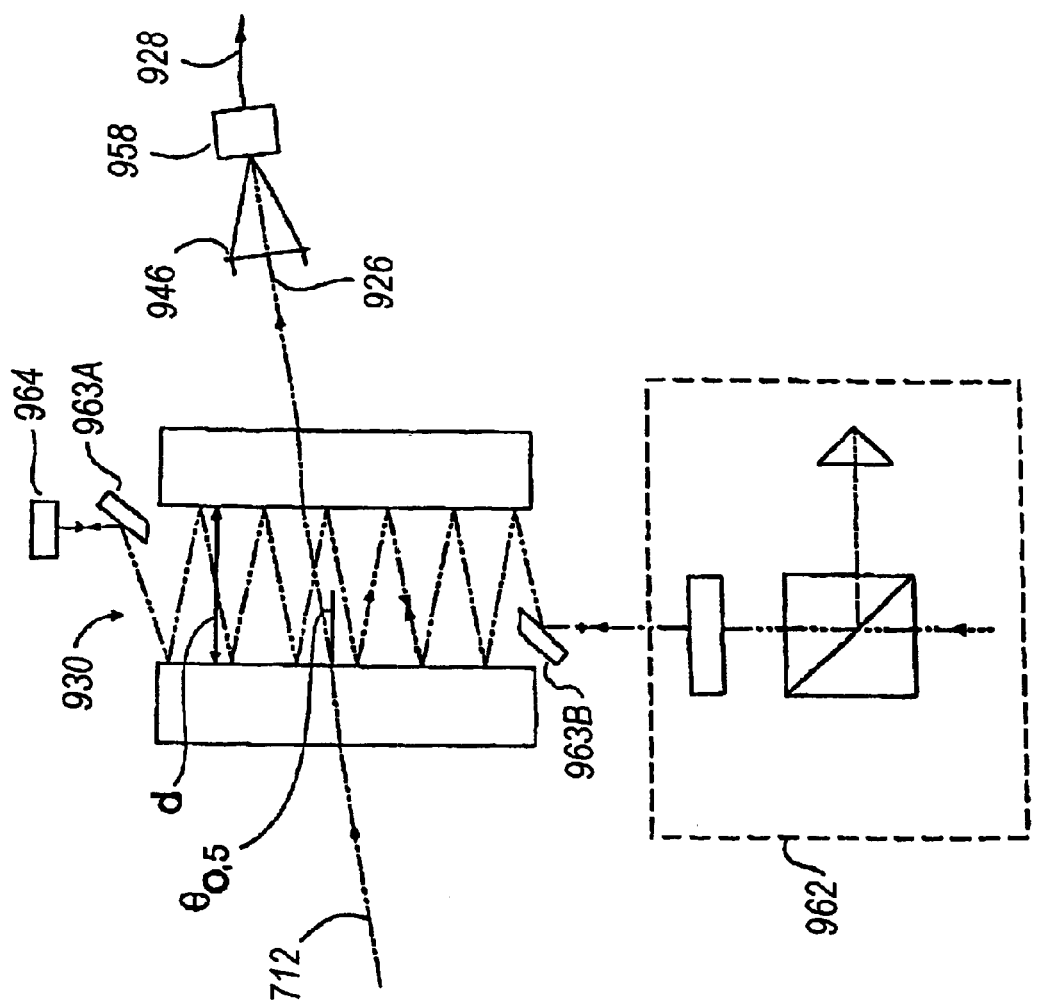
FIGS. 9a–9b are schematic diagrams of another embodiment of an angle interferometer.

A second embodiment of an angle interferometer is shown schematically in FIG. 9a. The second embodiment measures changes in the direction of propagation of a beam in one plane relative to a direction fixed by the apparatus of the fourth embodiment. In the second embodiment, a change in the direction of the beam is first converted to information contained in a change in an optical path length and then the information contained in the change in the optical path length is measured interferometrically. The measured change in the optical path is subsequently used to determine the corresponding change in the direction of the beam.

The apparatus of the second embodiment is shown in FIG. 9a. In this embodiment, input beam 712 is a single frequency optical beam. Input beam 712 impinges on an etalon generally indicated by element number 930 with gap d. The angle of incidence of input beam 712 at the interior surfaces of etalon 930 is $\theta_{o,5}$. Angle $\theta_{o,5}$ is selected so that the transmission of input beam 712 is substantially at a maximum excluding the maximum in transmission possible at $\theta_{o,5}=0$. Input beam 712 is transmitted as output beam 926. Beam 926 is focused by a lens 946 to an image spot on detector 958. The beam forming the image spot is detected, preferably by photoelectric detection, by detector 958 as electrical interference signal 928.

Apparatus of the second embodiment further comprises a differential plane mirror interferometer 962 with measurement object formed by mirrors 963A, 963B, and 964 and the reflecting surfaces of etalon 930.

The intensity profile, at the image spot in the plane of FIG. 9a for the beam responsible for signal $s_5$ indicated as element 928 in FIG. 9a, is written to a good approximation as $$I_{h,5} = \frac{C_5(1-R_5)^2}{[(1-R_5)^2 + 4R_5 \sin^2(\delta_5'/2)]} \mathrm{sinc}^2[kp_5(b/2)] \quad (16)$$

where $$\delta_5' = 2knd(p_5 \tan\theta_{o,5} + \cos\theta_{o,5}), \quad (17)$$

$$p_5 = \sin\theta_{o,5} + \sin\theta_{i,5}, \quad (18)$$

Figure 9B:
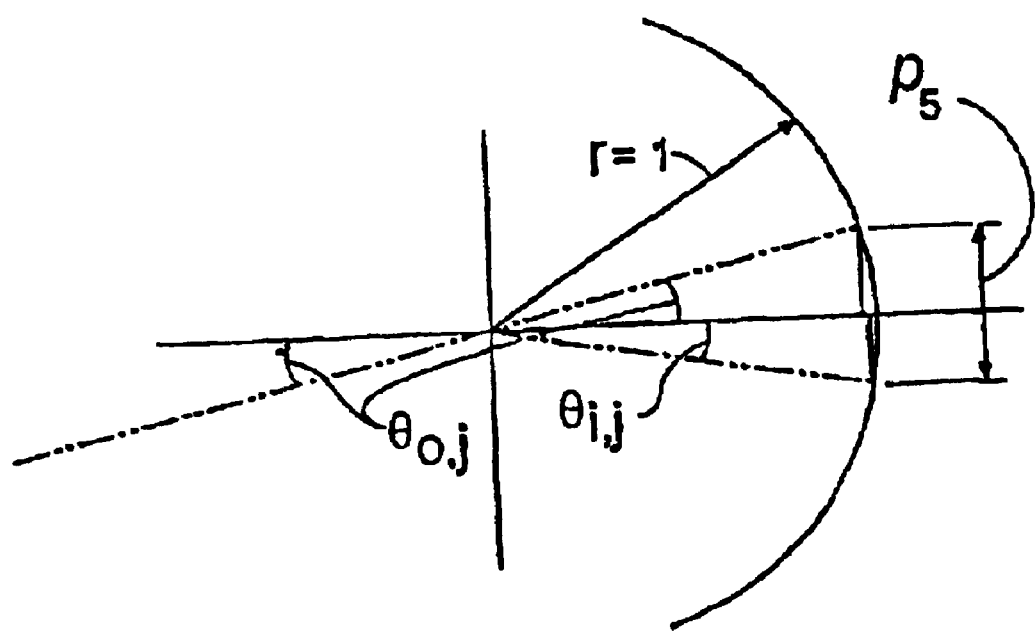

$C_5$ is a proportionality constant, and $R_5$ is the intensity reflectivity for the reflecting surfaces of etalon 930. Parameter $p_5$ is also shown in FIG. 9b.

For a high finesse etalon system, $I_{h,5}$ given by Eq. (16) reduces to $$I_{h,5} = C_5 \mathrm{sinc}^2[kp_5(b/2)] \quad (19)$$

with $\delta_5' = 2q_5\pi$ where $q_5$ is an integer. $I_{h,5}$ expressed by Eq. (19) may be written in a Taylor series about a value $(p_5)_0$ of $p_5$ as $$I_{h,5} = C_5 \left\{ \begin{array}{l} \mathrm{sinc}^2[k(p_5)_0(b/2)] - \\ \frac{1}{6}\mathrm{sinc}[k(p_5)_0(b/2)](kb)^2(p_5)_0 \times \\ [p_5 - (p_5)_0] + \ldots \end{array} \right\}. \quad (20)$$

From Eq. (17), we obtain the relationship $$[p_5 - (p_5)_0] = -\frac{[(nd) - (nd)_0]\cos\theta_{o,5}}{(nd)_0 \tan\theta_{o,5}}. \quad (21)$$

Higher order terms have been omitted in Eq. (21) for the purpose of displaying the important features of the angle interferometer without departing for the scope or spirit of the present invention.

In the operation of the second embodiment, the quantity (nd) is modulated at an angular frequency $\omega_5$ with an amplitude $\Delta(nd)$ or written as a formula $$(nd) = (nd)_0 + \Delta(nd)\cos\omega_5 t. \quad (22)$$

With the use in Eq. (20) expressions for $p_5$ and (nd) given by Eqs. (21) and (22), we obtain the equation for $I_{h,5}$ $$I_{h,5} = C_5 \left\{ \begin{array}{l} \mathrm{sinc}^2\left[\frac{k(p_5)_0 b}{2}\right] - \\ \frac{1}{6}\mathrm{sinc}\left[\frac{k(p_5)_0 b}{2}\right]\left(\frac{\cos\theta_{o,5}}{\tan\theta_{o,5}}\right)\left(\frac{\Delta(nd)}{nd}\right) \times \\ (kb)^2 (p_5)_0 \cos\omega_5 t + \ldots \end{array} \right\}. \quad (23)$$

The amplitude of the Fourier component of $I_{h,5}$ at angular frequency $\omega_5$ is proportional to a non-zero value of $(p_5)_0$. In the second embodiment, measured values of the Fourier component can be used as the error signal in a servo control system to servo control $(p_5)$ such that $(p_5)_0=0$. It will be appreciated that if $(p_5)_0=0$, optical beam 913 is passing through a place in image space where there is a maximum for the transfer function of etalon 930 and is illustrated in FIG. 9b.

The control of $(p_5)_0$ in the second embodiment is by modifying the spacing d of etalon 930 by piezoelectric transducers (not shown in FIG. 9a). The signal to the piezoelectric transducers is derived from signal 928.

Note that the amplitude of the Fourier component exhibits a high sensitivity to an error or non-zero value in $(p_5)_0$ because of the presence of factor $(kb)^2/(6 \tan \theta_{o,5})$. For example, the value for the factor $(kb)^2/(6 \tan \theta_{o,5})$ is $1.9 \times 10^{10}$ for b=4 mm, n=1.000, $\lambda$=633 nm, and $\theta_{o,5}$=0.014 rad. At an error in $(p_5)_0$ of $10^{-8}$ radians and a $[\Delta(nd)/(nd)]= 10^{-5}$, the amplitude of the signal at $\omega_5$ relative to signal component with amplitude $C_5$ is 0.0019.

The control of $(p_5)_0$ that $(p_5)_0=0$ converts a change in the direction of propagation of input beam 913 to information contained in a change in an optical path length. Next, the information contained in the change in the optical path length (nd) is used to determine the corresponding change in the direction of propagation of input beam 913. The changes in optical path length (nd) are measured interferometrically in the second embodiment by the second interferometer, differential plane mirror interferometer 962. Changes in $\theta_{o,5}$ are then obtained from the measured changes in optical path length (nd) using Eq. (17) noting that $\delta'_5 = 2q_5 \pi$ and $(p_5)_0=0$. The measurement beam of interferometer 962 is arranged to make multiple reflections at the high reflectivity surfaces of etalon 930 to increase sensitivity of the second interferometer 962 to changes in optical path length (nd).

For end use applications where beam 913 is a beam derived from a displacement measuring interferometer operating in a heterodyne mode, the source of the input beam for the second interferometer 962 is a portion of two frequency input beam to the displacement measuring interferometer so that the second interferometer 962 also operates in a heterodyne mode.

The remaining description of the fourth embodiment of the angle interferometer is the same as corresponding portions of the description given for the description of the third embodiment.

Other forms of angle interferometers such as described in commonly owned U.S. patent applications having Ser. No. 09/842,556 filed Apr. 26, 2001 and entitled "DYNAMIC ANGLE MEASURING INTERFEROMETER," and Ser. No. 09/852,369 filed May 10, 2001 and entitled "APPARATUS AND METHOD FOR INTERFEROMETRIC MEASUREMENTS OF ANGULAR ORIENTATION AND DISTANCE TO A PLANE MIRROR OBJECT," both by Henry A. Hill, and Provisional Patent Application No. 60/351,496, filed on Jan. 24, 2002, entitled "INTERFEROMETERS FOR MEASURING CHANGES IN OPTICAL BEAM DIRECTION," by Henry A. Hill and Justin Kreuzer, may be incorporated in the above-described embodiments of angle interferometers and variants thereof without departing from the spirit and scope of the present invention, the contents of the three cited patent applications being incorporated herein by reference.

Embodiments of the present invention configured with single pass interferometers and one or two angle interferometers, such as those described herein, may be used to make in-situ characterizations of object mirrors located on a wafer stage. The description of these embodiments are the same as corresponding portions of the description given for use of dynamic interferometers in in-situ characterization of on stage object mirrors in commonly owned U.S. patent application having Ser. No. 09/853,114 filed May 10, 2001 entitled "In-situ Mirror Characterization", by Henry Allen Hill, the contents of which are incorporated herein by reference.

In other embodiments, the passive zero shear interferometer may be located on a wafer stage and the object mirrors located off the wafer stage.

The interferometry systems described above provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p.82 (1997).

Overlay depends directly on the performance, i.e., accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 10A:
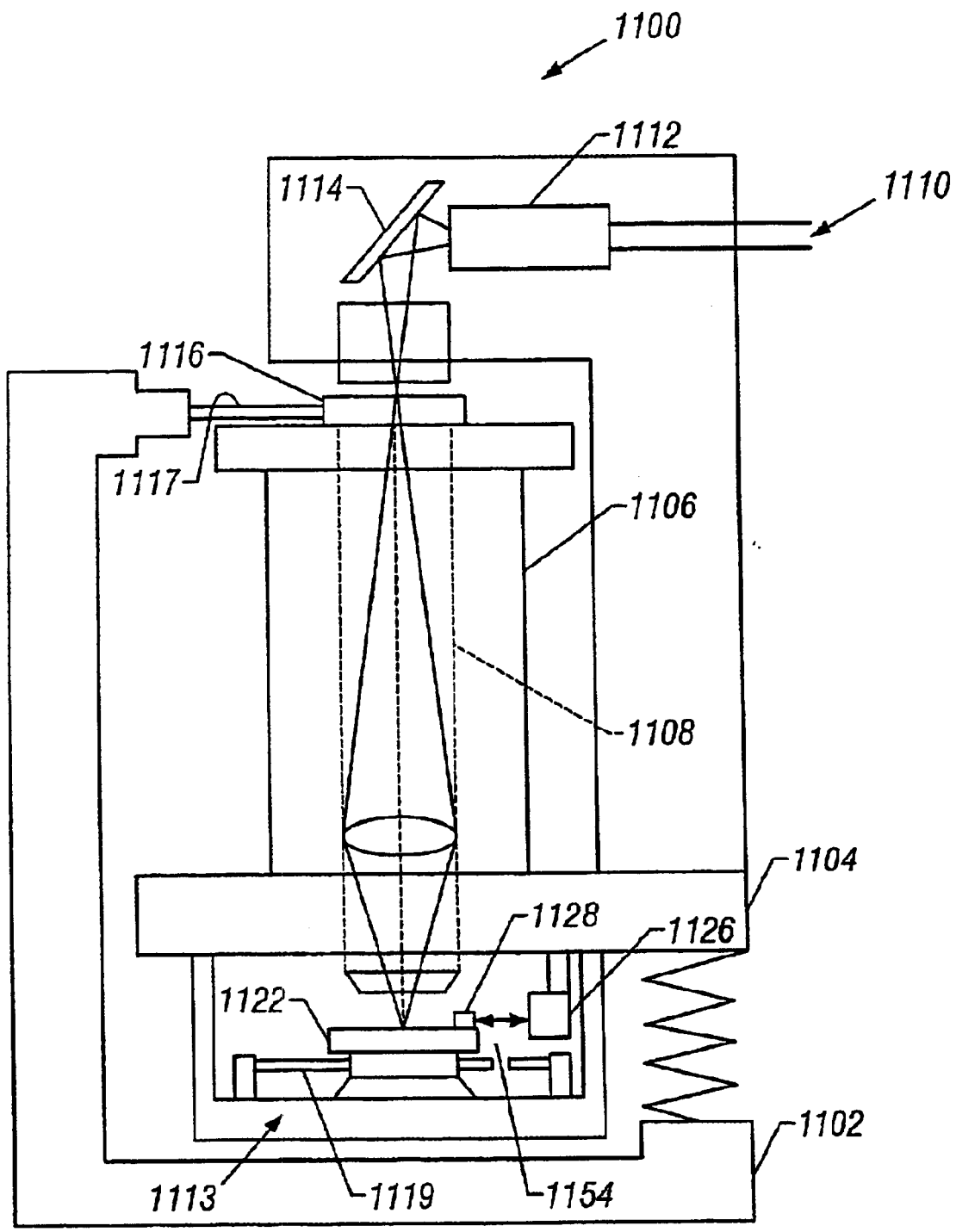
FIG. 10a is schematic diagram of a lithography system that includes an interferometry system described herein and is used to make integrated circuits.

An example of a lithography scanner 1100 using an interferometry system 1126 is shown in FIG. 10a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 10B:
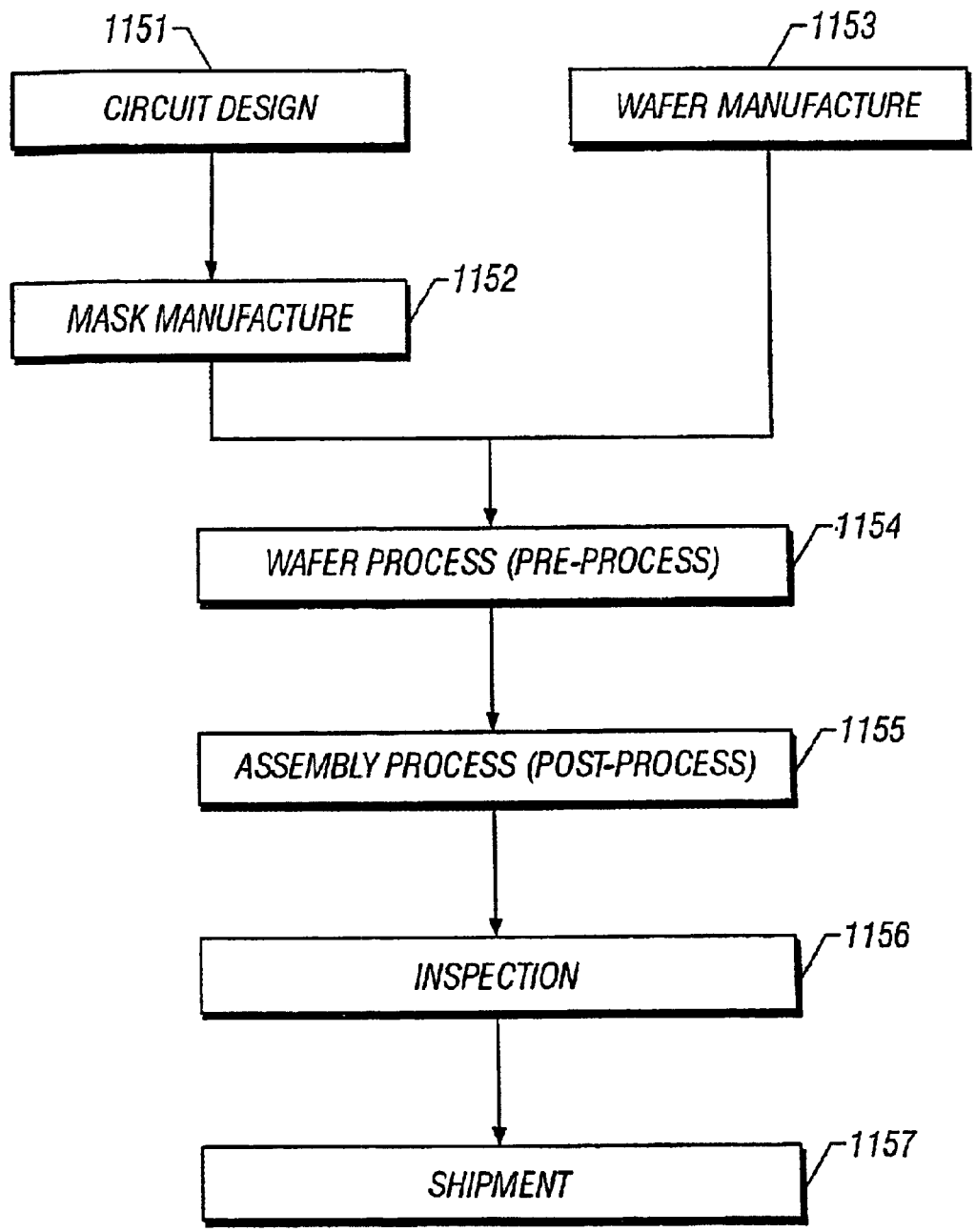
FIGS. 10b–10c are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 10b and 10c. FIG. 10b is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative to the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 10C:
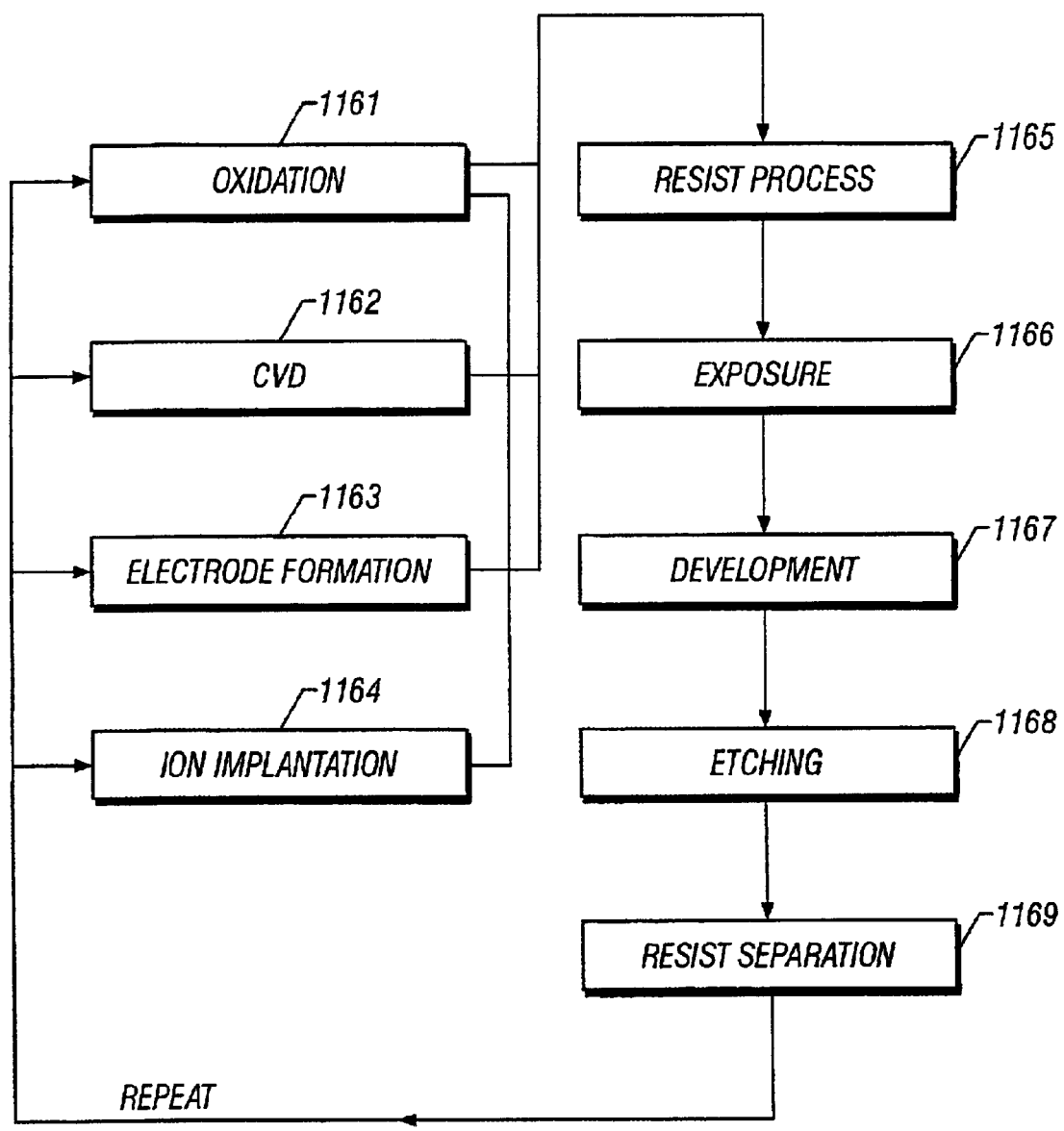

FIG. 10c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 11:
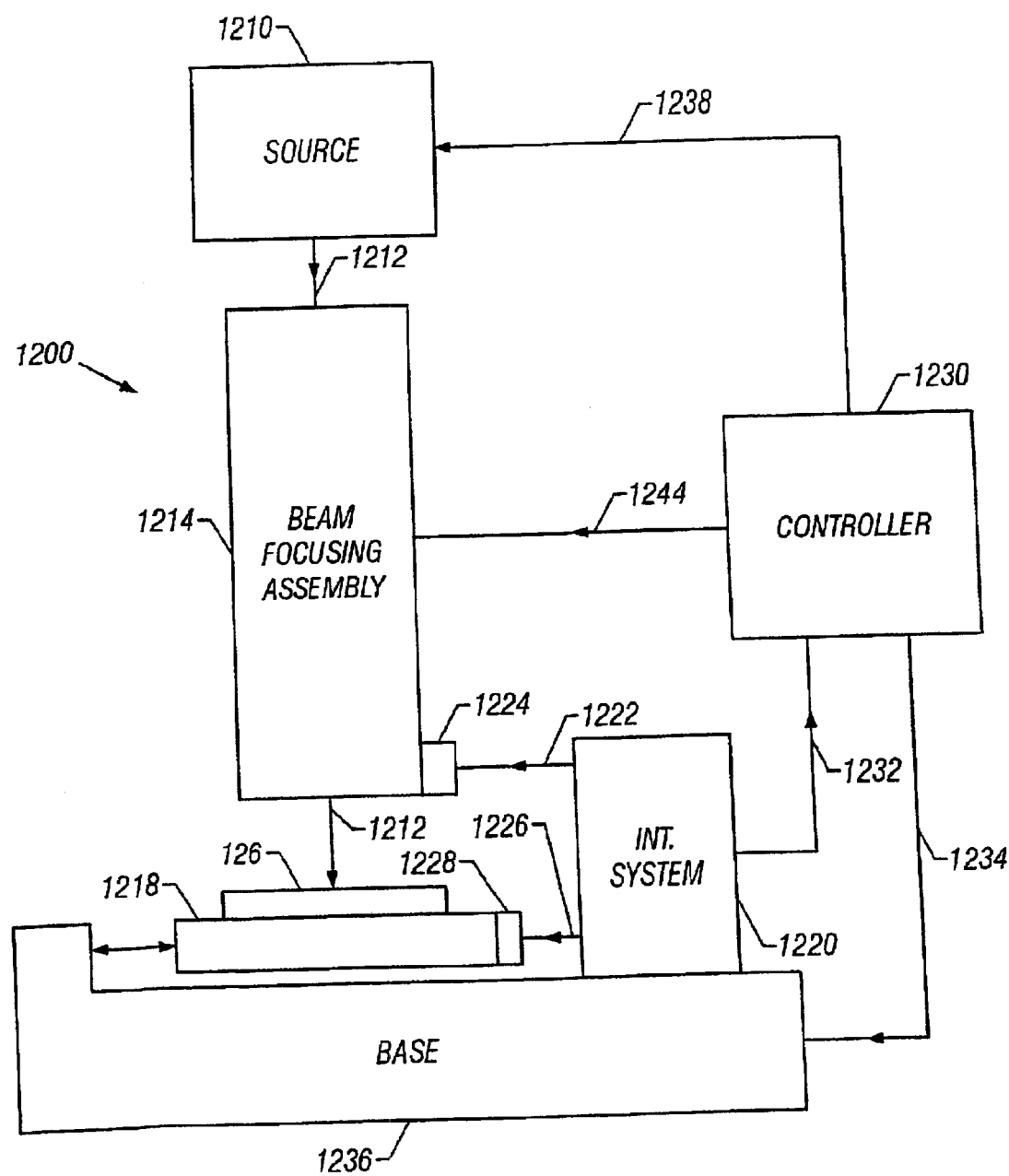
FIG. 11 is a schematic of a beam writing system that includes an interferometry system described herein.

As an example, a schematic of a beam writing system 1200 is shown in FIG. 11. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. An interferometry system, comprising:
   a beam conditioning assembly positioned to direct an input light beam to reflect from a measurement object and derive a conditioned beam from the input beam after it reflects from the measurement object; and
   an interferometer positioned to receive the conditioned beam, wherein during operation the interferometer splits the conditioned beam into a measurement beam and at least one other beam, directs the measurement beam to reflect from the measurement object, and overlaps the measurement beam after it reflects from the measurement object with the other beam to form an output beam.

2. The interferometry system of claim 1, wherein the measurement object comprises a plane mirror.

3. The interferometry system of claim 2, wherein during operation the beam conditioning assembly causes the measurement beam to be orthogonal to the plane mirror for a range of orientations of the plane mirror.

4. The interferometry system of claim 2, wherein the beam conditioning assembly comprises an optical system that directs the input beam to reflect from the plane mirror to cause a change in propagation direction of the conditioned beam in response to a change in the angular orientation of the plane mirror with respect to the input beam.

5. The interferometry system of claim 4, wherein the optical system causes the input beam to contact the plane mirror once.

6. The interferometry system of claim 4, wherein the optical system comprises a single pass interferometer.

7. The interferometry system of claim 4, wherein the beam conditioning assembly further comprises an afocal system that scales the change in the propagation direction of the conditioned beam by an amount related to a magnification factor of the afocal system.

8. The interferometry system of claim 7, wherein the magnification factor is 2.

9. The interferometry system of claim 7, wherein the beam conditioning assembly further comprises an image inverter positioned to invert the change in the propagation direction to cause the measurement beam to be orthogonal to the plane mirror for a range of orientations of the plane mirror.

10. The interferometry system of claim 9, wherein during operation the beam conditioning assembly further shears the input beam to reduce shear of the conditioned beam entering the interferometer.

11. The interferometry system of claim 10, wherein the beam conditioning assembly further comprises a double pass optical system that causes the input beam to reflect from the plane mirror twice.

12. The interferometry system of claim 11, wherein the double pass optical system comprises an etalon oriented relative to a preselected orientation of the plane mirror so that the etalon substantially transmits the input beam and substantially reflects a first intermediate beam corresponding to the input beam once-reflected from the plane mirror.

13. The interferometry system of claim 12, wherein the etalon substantially transmits a second intermediate beam corresponding to the input beam twice-reflected from the plane mirror.

14. The interferometry system of claim 11, wherein the double pass optical system comprises a double pass interferometer positioned to direct an input beam having a first polarization state to contact the plane mirror twice.

15. The interferometry system of claim 14, wherein the double pass optical system further comprises a first polarizing beam splitter and a first waveplate, which receive the input beam, splits the input beam into a first component having the first polarization state and a second component, and rotates a polarization state of the second component to be substantially parallel to the first polarization state, and further directs the first and second components towards the double pass interferometer.

16. The interferometry system of claim 11, wherein the beam conditioning assembly includes a second afocal system which during operation changes the shear of the twice-reflected input beam by an amount related to a magnification factor of the afocal system.

17. The interferometry system of claim 16, wherein the magnification factor is 0.5.

18. The interferometry system of claim 3, wherein during operation the beam conditioning assembly shears the input beam to reduce shear of the conditioned beam entering the interferometer.

19. The interferometry system of claim 2, wherein during operation the beam conditioning assembly shears the input beam in response to a change in the angular orientation of the plane mirror with respect to the input beam, thereby reducing shear of the output beam.

20. The interferometry system of claim 2, wherein the beam conditioning assembly comprises a first optical system that causes the measurement beam to be orthogonal to the plane mirror for a range of orientations of the plane mirror and a second optical system that reduces shear of the conditioned input beam entering the interferometer.

21. The interferometry system of claim 20, wherein the beam conditioning system directs the input beam to the second optical system and then to the first optical system.

22. The interferometry system of claim 20, wherein the first optical system causes the input beam to contact the plane mirror an odd number of times.

23. The interferometry system of claim 22, wherein the first optical system comprises a single pass plane mirror interferometer.

24. The interferometry system of claim 20, wherein the first optical system comprises an afocal system that scales a change in a propagation direction of the conditioned beam by an amount related to a magnification factor of the afocal system.

25. The interferometry system of claim 20, wherein the first optical system comprises an image inverter positioned to invert a change in a propagation direction of the conditioned beam.

26. The interferometry system of claim 20, wherein the second optical system causes the input beam to contact the plane mirror an even number of times.

27. The interferometry system of claim 26, wherein the second optical system comprises a double pass plane mirror interferometer.

28. The interferometry system of claim 20, wherein the second optical system comprises an afocal system that changes a shear of the conditioned beam.

29. The interferometry system of claim 1, wherein the measurement object is a retroreflector.

30. The interferometry system of claim 29, wherein the beam conditioning assembly comprises an afocal system and relay optics.

31. The interferometry system of claim 30, wherein the retroreflector directs the input beam towards the afocal system which changes a shear of the conditioned beam by an amount related to a magnification factor of the afocal system.

32. The interferometry system of claim 31, wherein the beam conditioning assembly reduces shear between the measurement beam and the at least one other beam in the output beam for a range of orientations and positions of the retroreflector.

33. The interferometry system of claim 29, wherein the interferometer is a single pass interferometer.

34. The interferometry system of claim 1, further comprising a light source positioned relative to the beam conditioning assembly so that during operation the light source directs the input beam toward the beam conditioning assembly.

35. The interferometry system of claim 34, wherein the input beam comprises first and second components having respective first and second frequencies and polarization states, wherein the first and second frequencies are different and the first and second polarization states are orthogonal.

36. The interferometry system of claim 1, further comprising a detector positioned to receive the output beam from the interferometer.

37. The interferometry system of claim 1, further comprising a reference detector positioned to receive a reference beam derived from the conditioned beam.

38. The interferometry system of claim 1, further comprising a second interferometer positioned to receive a secondary beam derived from the conditioned beam, wherein during operation the second interferometer splits the secondary beam into a secondary measurement beam and at least one other beam and directs the secondary measurement beam toward the measurement object, and overlaps a reflected secondary measurement beam and the other beam to form a secondary output beam.

39. The interferometry system of claim 1, further comprising an angle measuring interferometer positioned to receive a conditioned angle measurement beam derived from the conditioned beam or the measurement beam.

40. The interferometry system of claim 39, wherein during operation the angle measuring interferometer splits the conditioned angle measurement beam into first and second components, directs the first and second components along first and second paths, and overlaps the first and second components at a detector.

41. The interferometry system of claim 40, wherein during operation the overlapping first and second components cause the detector to generate an interference signal related to a propagation direction of the conditioned angle measurement beam.

42. The interferometry system of claim 41, wherein the interference signal is related to the orientation of the measurement object.

43. The interferometry system of claim 39, wherein the angle measuring interferometer comprises an etalon and transmission of the conditioned angle measurement beam through the etalon is related to a propagation direction of the conditioned angle measurement beam.

44. A lithography system for fabricating integrated circuits comprising:
first and second components, the first and second components being movable relative to one another; and the interferometry system of claim 1 secured to the second component, wherein the measurement object is rigidly secured to the first component and during operation the interferometry system measures the position of the first component relative to the second component.

45. The lithography system of claim 44, wherein one of the first and second components is a movable stage which during operation supports a wafer.

46. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the interferometry system of claim 1 for monitoring the position of the wafer relative to the imaged radiation.

47. A lithography system for use in fabricating integrated circuits on a wafer, the system comprising:
a stage for supporting the wafer; and
an illumination system including a radiation source, a mask, a positioning system, a lens assembly, and the interferometry system of claim 1,
wherein during operation the source directs radiation through the mask to produce spatially patterned radiation, the positioning system adjusts the position of the mask relative to the radiation from the source, the lens assembly images the spatially patterned radiation onto the wafer, and the apparatus monitors the position of the mask relative to the radiation from the source.

48. A beam writing system for use in fabricating a lithography mask, the system comprising:
a source providing a write beam to pattern a substrate;
a stage supporting the substrate;
a beam directing assembly for delivering the write beam to the substrate;
a positioning system for positioning the stage and beam directing assembly relative one another; and
the interferometry system of claim 1 for monitoring the position of the stage relative to the beam directing assembly.

49. A method for fabricating integrated circuits, the method comprising using the lithography system of claim 46.

50. A method for fabricating integrated circuits, the method comprising using the lithography system of claim 47.

51. An interferometry method, comprising:
deriving a conditioned beam from an input beam by directing the input beam to contact a measurement object at least once;
splitting the conditioned beam into a measurement beam and at least one other beam;
directing the measurement beam to reflect from the measurement object at least once; and
overlapping the reflected measurement beam and the at least one other beam to form an output beam.

52. The interferometry method of claim 51, wherein the conditioned beam is derived to reduce a shear between the overlapping reflected measurement beam and the at least one other beam in the output beam for a range of positions of the measurement object.

53. The interferometry method of claim 51, wherein the measurement object is a plane mirror.

54. The interferometry method of claim 53, wherein the measurement beam is orthogonal to the plane mirror for a range of incident angles of the input beam on the plane mirror.

55. The interferometry method of claim 54, wherein deriving the conditioned beam comprises directing the input beam to reflect from the plane mirror to change a propagation direction of the measurement beam in response to a change in the angular orientation of the plane mirror with respect to the input beam.

56. The interferometry method of claim 55, wherein deriving the conditioned beam further comprises directing a reflected input beam through an afocal system to scale the change in propagation direction by an amount related to a magnification factor of the afocal system.

57. The interferometry method of claim 56, wherein deriving the conditioned beam further comprises directing the reflected input beam through an image inverter to invert the change in propagation direction to cause the measurement beam to be orthogonal to the plane mirror for a range of orientations of the plane mirror.

58. The interferometry method of claim 57, wherein deriving the conditioned beam further comprises shearing the reflected input beam in response to changes in the orientation of the plane mirror with respect to the input beam.

59. The interferometry method of claim 58, wherein deriving the conditioned beam further comprises directing the sheared input beam through a second afocal system to scale the shear by an amount related to a magnification of the second afocal system.

60. The interferometry method of claim 59, wherein the reflected input beam is sheared to reduce shear of the conditioned beam entering the interferometer.

61. The interferometry method of claim 51, further comprising detecting an intensity of the output beam.

62. The interferometry method of claim 51, wherein the measurement object is a retroreflector.

63. The interferometry method of claim 51, further comprising deriving a conditioned angle measurement beam from the output beam or measurement beam and directing the conditioned angle measurement beam to an angle measuring interferometer.

64. The interferometry method of claim 63, wherein the angle measuring interferometer splits the conditioned angle measurement beam into first and second components, directs the first and second components along first and second paths, and overlaps the first and second components at a detector.

65. The interferometry method of claim 64, wherein the overlapping first and second components cause the detector to generate an interference signal related to a propagation direction of the conditioned angle measurement beam.

66. The interferometry method of claim 65, wherein the interference signal is related to the orientation of the measurement object.

67. The interferometry method of claim 51, wherein the input beam contacts the measurement object an odd number of times.

68. The interferometry method of claim 67, wherein the input beam contacts the measurement object three times.

69. The interferometry method of claim 51, wherein the measurement beam contacts the measurement object an odd number of times.

70. The interferometry method of claim 69, wherein the measurement beam contacts the measurement object once.

71. The interferometry method of claim 51, wherein the measurement beam contacts the measurement object an even number of times.

72. The interferometry method of claim 71, wherein the measurement beam contacts the measurement object twice.

73. A lithography method for use in fabricating integrated circuits on a wafer, the method comprising:

supporting the wafer on a moveable stage;

imaging spatially patterned radiation onto the wafer, adjusting the position of the stage; and monitoring the position of the stage using the interferometry method of claim 51.

74. A lithography method for use in the fabrication of integrated circuits comprising:

directing input radiation through a mask to produce spatially patterned radiation;

positioning the mask relative to the input radiation;

monitoring the position of the mask relative to the input radiation using the interferometry method of claim 51; and imaging the spatially patterned radiation onto a wafer.

75. A lithography method for fabricating integrated circuits on a wafer comprising:

positioning a first component of a lithography system relative to a second component of a lithography system to expose the wafer to spatially patterned radiation; and monitoring the position of the first component relative to the second component using the interferometry method of claim 51.

76. A method for fabricating integrated circuits, the method comprising the lithography method of claim 73.

77. A method for fabricating integrated circuits, the method comprising the lithography method of claim 74.

78. A method for fabricating integrated circuits, the method comprising the lithography method of claim 75.

79. A method for fabricating a lithography mask, the method comprising:

directing a write beam to a substrate to pattern the substrate;

positioning the substrate relative to the write beam; and monitoring the position of the substrate relative to the write beam using the interferometry method of claim 51.

80. An interferometry system, comprising:

a beam conditioning assembly positioned to direct an input light beam to reflect from a measurement object and derive a conditioned beam from the input beam after it reflects from the measurement object; and an interferometer positioned to receive the conditioned beam and split the conditioned beam into a measurement beam and at least one other beam, the interferometer directs the measurement beam to reflect from the measurement object, and overlaps the measurement beam after it reflects from the measurement object with the other beam to form an output beam, wherein for a range of orientations of the measurement object the beam conditioning assembly causes the measurement beam to be orthogonal to the measurement object.

\* \* \* \* \*